US012687781B2

(12) United States Patent
Kim et al.

(10) Patent No.: US 12,687,781 B2
(45) Date of Patent: Jul. 21, 2026

(54) BRUSH POLYMER, PHOTORESIST COMPOSITION INCLUDING THE SAME, AND METHOD OF MANUFACTURING INTEGRATED CIRCUIT DEVICE

(71) Applicant: SAMSUNG ELECTRONICS CO., LTD., Suwon-si (KR)

(72) Inventors: Jinjoo Kim, Seoul (KR); Sumin Kim, Suwon-si (KR); Hyunwoo Kim, Seongnam-si (KR); Yechan Kim, Hwaseong-si (KR); Juyoung Kim, Hwaseong-si (KR); Jicheol Park, Anyang-si (KR); Giyoung Song, Hwaseong-si (KR); Suk Koo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 824 days.

(21) Appl. No.: 18/076,818

(22) Filed: Dec. 7, 2022

(65) Prior Publication Data

US 2023/0194985 A1 Jun. 22, 2023

(30) Foreign Application Priority Data

Dec. 22, 2021 (KR) ........................ 10-2021-0185407

(51) Int. Cl.
*G03F 7/039* (2006.01)
*H10P 76/20* (2026.01)

(52) U.S. Cl.
CPC ........ *G03F 7/0392* (2013.01); *H10P 76/2042* (2026.01); *H10P 76/2043* (2026.01)

(58) Field of Classification Search
CPC . G03F 7/0392; G03F 7/26; G03F 7/38; G03F 7/0046; G03F 7/11; G03F 7/004;
(Continued)

(56) References Cited

U.S. PATENT DOCUMENTS 6,503,686 B1 1/2003 Fryd et al.
9,223,217 B2 12/2015 Sanders et al.
(Continued)

FOREIGN PATENT DOCUMENTS

CN 113050369 A 6/2021
JP 1996-320574 A 12/1996
(Continued)

*Primary Examiner* — Caleen O Sullivan
(74) *Attorney, Agent, or Firm* — Muir Patent Law, PLLC

(57) ABSTRACT

A brush polymer for a photoresist, a photoresist composition, and a method of manufacturing an integrated circuit device, the brush polymer including a core and a plurality of side polymer chains, the plurality of side polymer chains being bonded to the core and extending from the core to form a bottle-brush polymer or a star-brush polymer, together with the core, wherein each of the plurality of side polymer chains includes a first repeating unit represented by Formula 1 and a second repeating unit represented by Formula 2:

[Formula 1]

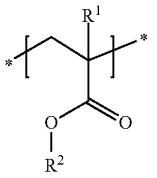

[Formula 2]

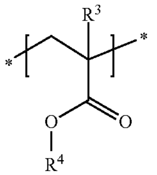

20 Claims, 14 Drawing Sheets

10

(58) Field of Classification Search
CPC ..... G03F 7/0382; G03F 7/16; H01L 21/0275; H01L 21/0276; H01L 21/02118; H01L 21/02205; H01L 21/02282; C08F 220/18; C08F 281/00
USPC ..... 430/311, 270.1, 326, 271.1, 272.1, 273.1
See application file for complete search history.

(56) References Cited

U.S. PATENT DOCUMENTS

| | | | | |
|---|---|---|---|---|
| 9,482,952 | B2 | 11/2016 | Wang et al. | |
| 9,563,128 | B2 | 2/2017 | Wang | |
| 9,758,610 | B2 | 9/2017 | Kramer | |
| 2007/0148585 | A1 | 6/2007 | Kaneko et al. | |
| 2015/0072292 | A1* | 3/2015 | Cho | G03F 7/0758 430/326 |
| 2015/0140490 | A1 | 5/2015 | Wang et al. | |
| 2019/0271913 | A1* | 9/2019 | De Silva | C08L 33/14 |
| 2023/0369060 | A1* | 11/2023 | Yang | G03F 7/70933 |

FOREIGN PATENT DOCUMENTS

| | | | |
|---|---|---|---|
| JP | 2003-215816 | A | 7/2003 |
| JP | 4768569 | B2 | 9/2011 |
| KR | 1020150028753 | A | 3/2015 |
| KR | 1020210096882 | A | 8/2021 |

* cited by examiner

BRUSH POLYMER, PHOTORESIST COMPOSITION INCLUDING THE SAME, AND METHOD OF MANUFACTURING INTEGRATED CIRCUIT DEVICE

CROSS-REFERENCE TO RELATED APPLICATION

This application is based on and claims priority under 35 U.S.C. §119 to Korean Patent Application No. 10-2021-0185407, filed on Dec. 22, 2021, in the Korean Intellectual Property Office, the disclosure of which is incorporated by reference herein in its entirety.

BACKGROUND

1. Field

Embodiments relate to a brush polymer, a photoresist composition including the same, and a method of manufacturing an integrated circuit (IC) device.

2. Description of the Related Art

Due to the development of electronics technology, the downscaling of semiconductor devices has rapidly progressed. Therefore, a photolithography process, which is advantageous in forming fine patterns, may be used.

SUMMARY

The embodiments may be realized by providing a brush polymer for a photoresist, the brush polymer including a core and a plurality of side polymer chains, the plurality of side polymer chains being bonded to the core and extending from the core to form a bottle-brush polymer or a star-brush polymer, together with the core, wherein each of the plurality of side polymer chains includes a first repeating unit represented by Formula 1 and a second repeating unit represented by Formula 2:

[Formula 1]

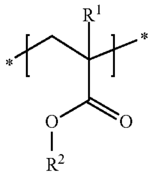

[Formula 2]

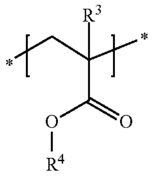

in Formulae 1 and 2, $R^1$ is a hydrogen atom, an unsubstituted methyl group, a fluorine atom, or a trifluoromethyl group, $R^2$ is a C3 to C30 fluoroaliphatic group including a hydroxyl group, $R^3$ is a hydrogen atom, an unsubstituted methyl group, a fluorine atom, or a trifluoromethyl group, and $R^4$ is a C2 to C20 organic group including an oxygen atom.

The embodiments may be realized by providing a photoresist composition including a brush polymer for a photoresist, the brush polymer including a core and a plurality of side polymer chains, the plurality of side polymer chains being bonded to the core and extending from the core to form a bottle-brush polymer or a star-brush polymer, together with the core; a chemically amplified polymer; a photoacid generator (PAG); and a solvent, wherein each of the plurality of side polymer chains includes a first repeating unit represented by Formula 1 and a second repeating unit represented by Formula 2, in Formulae 1 and 2, $R^1$ is a hydrogen atom, an unsubstituted methyl group, a fluorine atom, or a trifluoromethyl group, $R^2$ is a C3 to C30 fluoroaliphatic group including a hydroxyl group, $R^3$ is a hydrogen atom, an unsubstituted methyl group, a fluorine atom, or a trifluoromethyl group, and $R^4$ is a C2 to C20 organic group including an oxygen atom.

The embodiments may be realized by providing a method of manufacturing an integrated circuit device, the method including forming a photoresist film on an underlying film by using a photoresist composition that includes a brush polymer, the brush polymer including a core and a plurality of side polymer chains, the plurality of side polymer chains being bonded to the core and extending from the core to form a bottle-brush polymer or a star-brush polymer, together with the core, a chemically amplified polymer, a photoacid generator (PAG), and a solvent; forming a surface-modified photoresist film having a hydrophilic surface portion, the hydrophilic surface portion being formed by segregating the brush polymer from the chemically amplified polymer in the photoresist film and distributing the brush polymers at a surface of the photoresist film, which is distal to the underlying film; generating an acid from the PAG by exposing a first area of the surface-modified photoresist film, which includes a portion of the hydrophilic surface portion, and deprotecting the chemically amplified polymer with the acid; pre-wetting the hydrophilic surface portion of the exposed surface-modified photoresist film with deionized water; removing the exposed first area of the surface-modified photoresist film by using a developer to form a photoresist pattern including a non-exposed area of the surface-modified photoresist film; and processing the underlying film by using the photoresist pattern, wherein each of the plurality of side polymer chains includes a first repeating unit represented by Formula 1 and a second repeating unit represented by Formula 2, in Formulae 1 and 2, $R^1$ is a hydrogen atom, an unsubstituted methyl group, a fluorine atom, or a trifluoromethyl group, $R^2$ is a C3 to C30 fluoroaliphatic group including a hydroxyl group, $R^3$ is a hydrogen atom, an unsubstituted methyl group, a fluorine atom, or a trifluoromethyl group, and $R^4$ is a C2 to C20 organic group including an oxygen atom.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
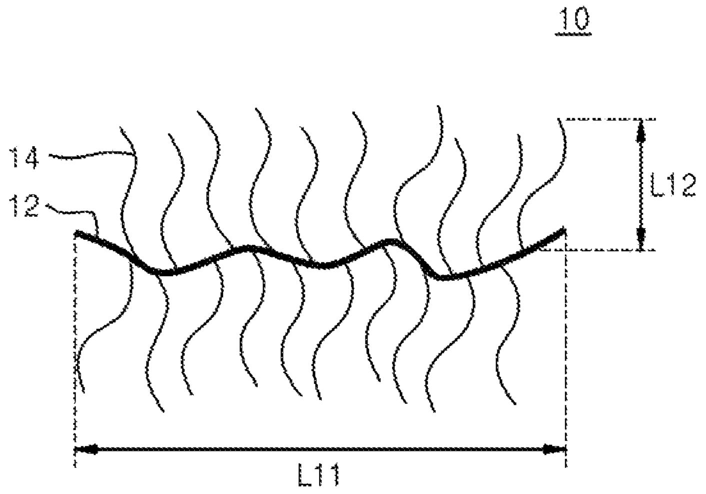
FIG. 1 is a diagram of a brush polymer for photoresist, according to embodiments.

A brush polymer for a photoresist, according to an embodiment, may include a core and a plurality of side polymer chains extending (e.g., outwardly) from the core. The plurality of side polymer chains may constitute, form, or be a bottle-brush polymer or a star-brush polymer, together or along with the core.

Each of the plurality of side polymer chains may include a first repeating unit of Formula 1 and a second repeating unit of Formula 2:

[Formula 1]

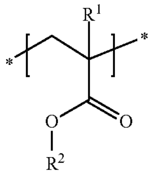

[Formula 2]

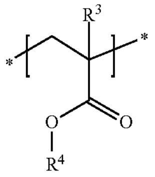

In Formulae 1 and 2, $R^1$ may be or may include, e.g., a hydrogen atom, an unsubstituted methyl group, a fluorine atom, or a trifluoromethyl group. As used herein, the term "or" is not an exclusive term, e.g., "A or B" would include A, B, or A and B.

$R^2$ may be or may include, e.g., a C3 to C30 fluoroaliphatic group including a hydroxyl group. Unless otherwise indicated, groups of Formulae described herein may be substituted or unsubstituted.

$R^3$ may be or may include, e.g., a hydrogen atom, an unsubstituted methyl group, a fluorine atom, or a trifluoromethyl group.

$R^4$ may be or may include, e.g., C2 to C20 organic group including an oxygen atom.

As used herein, * denotes a bonding site.

In an implementation, in Formula 1, $R^2$ may be, e.g., represented by Chemical Formula 1:

$$*—R^{21}—(R^{22})_k \quad \text{[Chemical Formula 1]}$$

In Chemical Formula 1, $R^{21}$ may be a divalent group, e.g., a C1 to C20 substituted or unsubstituted linear alkylene group, a C3 to C20 substituted or unsubstituted branched alkylene group, a C3 to C20 substituted or unsubstituted cycloalkylene group, or a combination thereof $R^{22}$ may be or may include, e.g., a C3 to C6 hydroxyalkyl group in which at least one hydrogen atom of an alkyl group is substituted with a fluorine atom.

k may be, e.g., 1 or 2.

As used herein, unless otherwise specified, the term "alkyl group" refers to including a linear or branched monovalent aliphatic hydrocarbon group. As used herein, unless otherwise specified, the term "alkylene group" refers to including a linear or branched divalent aliphatic hydrocarbon group. As used herein, a "fluoroalkyl group" or a "fluoroalkylene group" may refer to a group in which some or all hydrogen atoms of the alkyl group or the alkylene group are substituted with a fluorine atom.

In Chemical Formula 1, the linear alkylene group of $R^{21}$ may be, e.g., a methylene group [$—CH_2—$], an ethylene group [$—(CH_2)_2—$], a trimethylene group [$—(CH_2)_3—$], a tetramethylene group [$—(CH_2)_4—$], or a pentamethylene group [$—(CH_2)_5—$].

In Chemical Formula 1, the branched alkylene group of $R^{21}$ may be an alkylalkylene group including, e.g., an alkylmethylene group (e.g., $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, or $—C(CH_2CH_3)_2—$); an alkylethylene group (e.g., $—CH(CH_3)CH_2—$, $—CH(CH_3)CH(CH_3)—$, $—C(CH_3)_2CH_2—$, $—CH(CH_2CH_3)CH_2—$, and $—C(CH_2CH_3)_2—CH_2—$); an alkyltrimethylene group (e.g., $—CH(CH_3)CH_2CH_2—$ and $—CH_2CH(CH_3)CH_2—$); or an alkyltetramethylene group (e.g., $—CH(CH_3)CH_2CH_2CH_2—$ and $—CH_2CH(CH_3)CH_2CH_2—$).

In Chemical Formula 1, the cycloalkylene group of $R^{21}$ may include, e.g., a divalent cyclic aliphatic hydrocarbon group. The divalent cyclic aliphatic hydrocarbon group may be, e.g., a monocyclic aliphatic hydrocarbon group or a polycyclic aliphatic hydrocarbon group. In an implementation, the monocyclic aliphatic hydrocarbon group may include a C3 to C6 monocycloalkyl group, e.g., a cyclopentyl group or a cyclohexyl group. The polycyclic aliphatic hydrocarbon group may include a C7 to C12 polycycloalkyl group, e.g., an adamantyl group, a norbornyl group, an isobornyl group, or a tricyclodecyl group.

In Chemical Formula 1, $R^{21}$ may include a substituent. The substituent may include, e.g., a fluorine atom, a C1 to C5 alkyl group substituted with a fluorine atom, an oxygen atom, or a monovalent cyclic aliphatic hydrocarbon group. The monovalent cyclic aliphatic hydrocarbon group may be, e.g., a monocyclic aliphatic hydrocarbon group or a polycyclic aliphatic hydrocarbon group. Examples of the monocyclic aliphatic hydrocarbon group and the polycyclic aliphatic hydrocarbon group may be the same as described above.

In Chemical Formula 1, a C3 to C6 hydroxyalkyl group, which is substituted with a fluorine atom of $R^{22}$, may be or may include, e.g., $—C(CF_3)_2OH$, $—C(C_2F_5)_2OH$, $—C(CF_3)(CH_3)OH$, or $—CH(CF_3)OH$.

In an implementation, the repeating unit of Formula 1 may be represented by, e.g., one of the following Chemical Formulae 1A to 1H.

[Chemical Formula 1A]

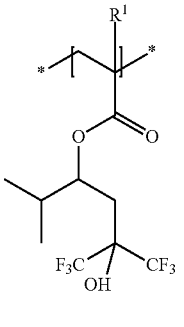

-continued

[Chemical Formula 1B]

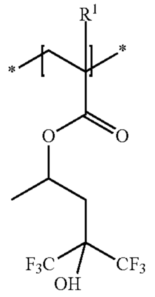

[Chemical Formula 1C]

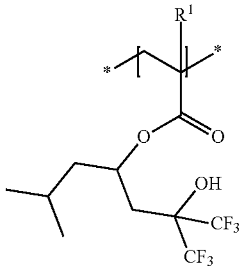

[Chemical Formula 1D]

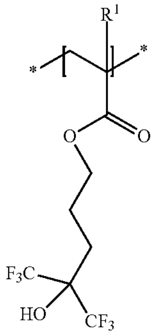

[Chemical Formula 1E]

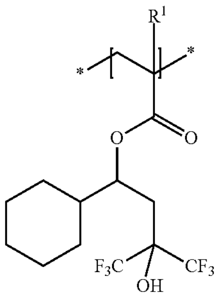

[Chemical Formula 1F]

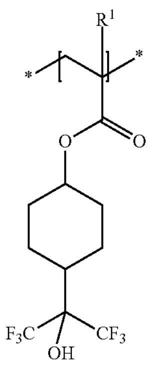

-continued

[Chemical Formula 1G]

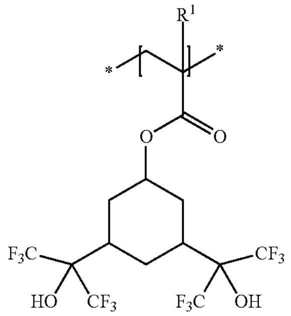

[Chemical Formula 1H]

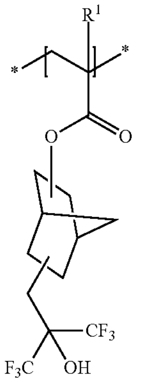

In an implementation, in Formula 2, $R^4$ may include, e.g., a hydroxyl group (OH), a hydroxyalkyl group, an oxyethylene group, a carboxyl group (COOH), a carbonyl group (CO), an aldehyde group (CHO), a lactone group, a phenol group, an oxo group (O═), or a combination thereof.

In an implementation, a repeating unit of Formula 2 may be represented by, e.g., one the following Chemical Formulae 2A to 2D.

[Chemical Formula 2A]

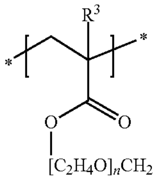

[Chemical Formula 2B]

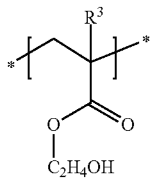

In Formula 2A, n may be an integer of, e.g., 1 to 100.

[Chemical Formula 2C]

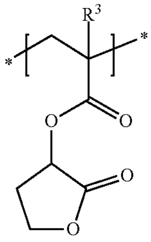

[Chemical Formula 2D]

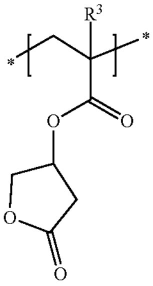

In the brush polymer for a photoresist, according to the embodiments, the plurality of side polymer chains may be covalently bonded to the core.

FIG. 1 is a diagram of a brush polymer 10 for a photoresist, according to embodiments.

Referring to FIG. 1, the brush polymer 10 for a photoresist may include a core 12 (including a backbone polymer extending lengthwise in a linear manner) and a plurality of side polymer chains 14, which are bonded to the core 12 and extend from the core 12. The brush polymer 10 for a photoresist, which includes the core 12 and the plurality of side polymer chains 14, may constitute or be a bottle-brush polymer.

In the brush polymer 10 for a photoresist, a maximum length L11 of the backbone polymer of the core 12 in a lengthwise direction may be greater than a maximum length L12 of each of the plurality of side polymer chains 14.

In an implementation, in the brush polymer 10 for a photoresist, the backbone polymer of the core 12 may include, e.g., polynorbornene, polyacetal, polyacryl, polycarbonate, polystyrene, polyester, or a combination thereof In an implementation, in the brush polymer 10 for a photoresist, the backbone polymer of the core 12 may have a main chain including, e.g., polynorbornene.

Each of the plurality of side polymer chains 14 may have a terminal group that is farthest from (e.g., distal to) the core 12 (e.g., at a terminal end thereof). In an implementation, the terminal group may be or include, e.g., a bromine atom or an organic group including a sulfur atom.

In an implementation, the brush polymer 10 for a photoresist may have a structure represented by, e.g., Formula 3.

[Formula 3]

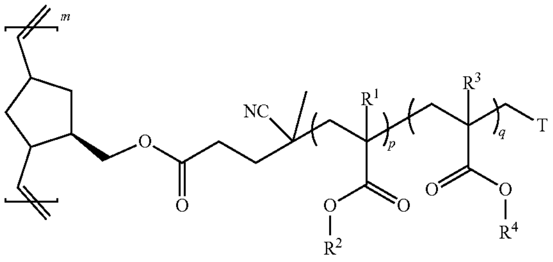

In Formula 3, m may be, e.g., an integer of 5 to 100. p and q may each independently be, e.g., an integer of 1 to 50. T may be, e.g., a bromine atom or an organic group including a sulfur atom. $R^1$, $R^2$, $R^3$, and $R^4$ may be defined the same as those described above.

In an implementation, the brush polymer 10 for a photoresist may have a structure represented by, e.g., Chemical Formula 3A.

[Chemical Formula 3A]

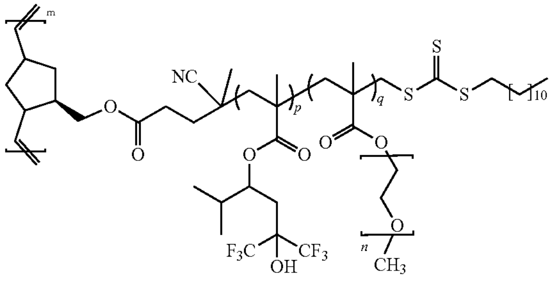

In Chemical Formula 3A, n may be, e.g., 3. m may be, e.g., an integer of 5 to 100. p and q may each independently be, e.g., an integer of 1 to 50.

In an implementation, the brush polymer 10 for a photoresist may have a structure represented by, e.g., Formula 4.

[Formula 4]

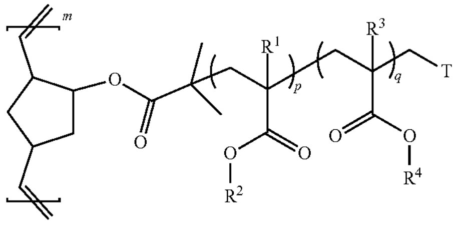

In Formula 4, m may be, e.g., an integer of 5 to 100. p and q may each independently be, e.g., an integer of 1 to 50. T may be, e.g., a bromine atom or an organic group including a sulfur atom. $R^1$, $R^2$, $R^3$, and $R^4$ may be defined the same as those described above.

In an implementation, the brush polymer 10 for a photoresist may have a structure represented by, e.g., Chemical Formula 4A.

[Chemical Formula 4A]

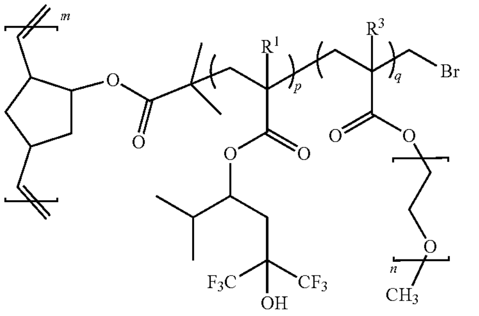

In Chemical Formula 4A, n may be, e.g., 3. m may be, e.g., an integer of 5 to 100. p and q may each independently be, e.g., an integer of 1 to 50.

Figure 2:
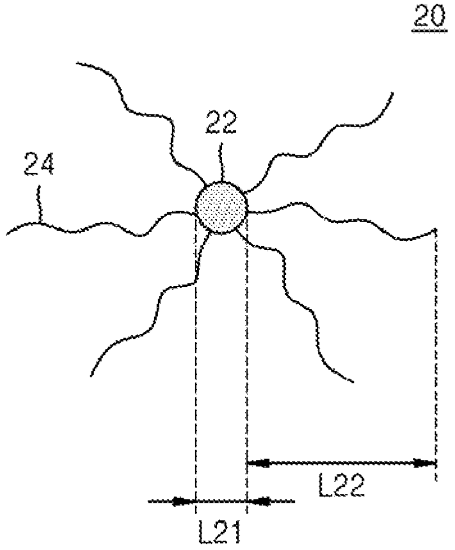
FIG. 2 is a diagram of a brush polymer for photoresist, according to embodiments.

FIG. 2 is a diagram of a brush polymer 20 for a photoresist, according to embodiments.

Referring to FIG. 2, the brush polymer 20 for a photoresist may include, e.g., a core 22 and a plurality of side polymer chains 24, which are bonded to the core 22 and extend from the core 22, e.g., in a radial direction. The brush polymer 20 for a photoresist, which includes the core 22 and the plurality of side polymer chains 24, may include or be a star-brush polymer.

In the brush polymer 20 for a photoresist, a maximum length L21 of the core 22 may be less than a maximum length L22 of each of the plurality of side polymer chains 24.

In an implementation, in the brush polymer 20 for a photoresist, the core 12 may have a pentaerythritol or dipentaerythritol core structure. Each of the plurality of side polymer chains 24 may have a terminal group that is farthest from (e.g., distal to) the core 22. In an implementation, the terminal group may include, e.g., a bromine atom or an organic group including a sulfur atom.

In an implementation, the brush polymer 20 for a photoresist may have a structure represented by, e.g., Formula 5:

[Chemical Formula 5]

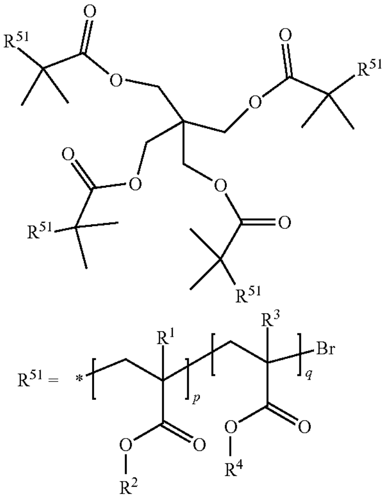

In Formula 5, p and q may each independently be, e.g., an integer of 1 to 50. $R^1$, $R^2$, $R^3$, and $R^4$ may be defined the same as those described above.

In an implementation, the brush polymer 20 for a photoresist may have a structure represented by, e.g., Chemical Formula 5A.

[Chemical Formula 5A]

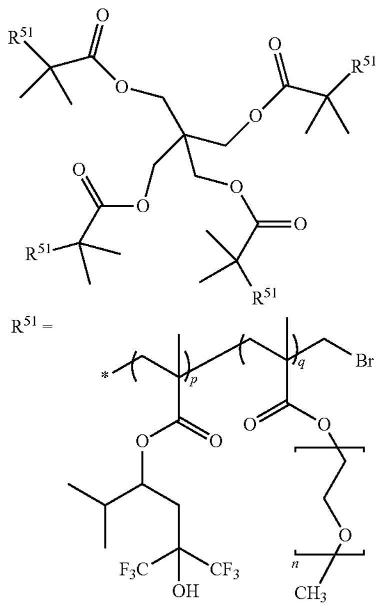

In Chemical Formula 5A, p and q may each independently be, e.g., an integer of 1 to 50. n may be, e.g., 3.

In an implementation, the brush polymer 20 for a photoresist may have a structure represented by, e.g., Formula 6.

[Formula 6]

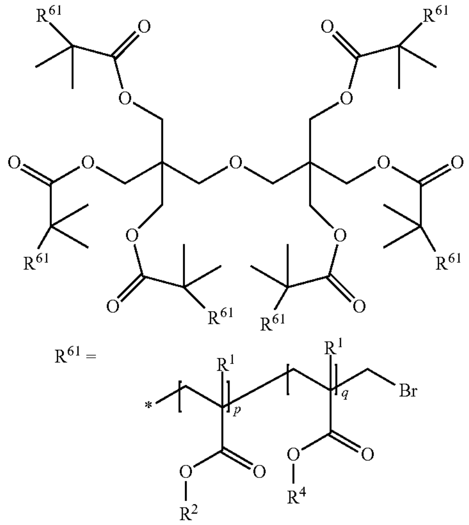

In Formula 6, p and q may each independently be, e.g., an integer of 1 to 50. $R^1$, $R^2$, $R^3$, and $R^4$ may be defined the same as those described above.

In an implementation, the brush polymer 20 for a photoresist may have a structure represented by, e.g., Chemical Formula 6A.

[Chemical formula 6A]

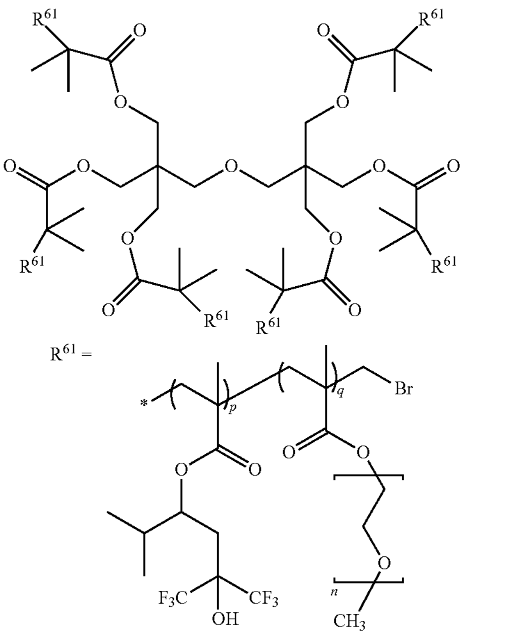

In Chemical Formula 6A, p and q may each independently be, e.g., an integer of 1 to 50. n may be, e.g., 3.

In the brush polymer for a photoresist, according to embodiments, $R^2$ of the first repeating unit of Formula 1 may be, e.g., a C3 to C30 fluoroaliphatic group including a hydroxyl group. $R^2$ may include a fluorine atom, and when the brush polymer for photoresist is in a photoresist film used in a photolithography process, the brush polymer for photoresist may help increase solubility in a developer during a developing process after the photoresist film is exposed. In addition, $R^2$ of the first repeating unit of Formula 1 may include a fluorine atom, and when the photoresist film including the brush polymer for a photoresist is exposed to a light source (e.g., an extreme ultraviolet (EUV) light source) having a relatively short wavelength and relatively high energy, the occurrence of defects (e.g., a line edge roughness (LER)) due to radiolysis or stochastic errors resulting from a random distribution of photons incident to the photoresist film may be minimized. In an implementation, $R^2$ of the first repeating unit of Formula 1 may include the hydroxyl group, and when the brush polymer for a photoresist is included in a photoresist film used in a photolithography process, the brush polymer for photoresist may help increase solubility in deionized water (DIW) during a pre-wetting process using DIW after the photoresist film is exposed and a developer is applied.

In the brush polymer for a photoresist, according to the embodiments, $R^4$ of the second repeating unit of Formula 2 may be, e.g., a hydrophilic functional group including a C2 to C20 organic group having an oxygen atom. $R^4$ may include the hydrophilic group including the oxygen atom, and after the photoresist film including the brush polymer for photoresist is exposed, solubility in DIW may be further increased in the pre-wetting process using DIW.

In the brush polymer for a photoresist, according to the embodiments, a plurality of side polymer chains (e.g., the plurality of side polymer chains 14 shown in FIG. 1 or the plurality of side polymer chains 24 shown in FIG. 2) may include the first repeating unit of Formula 1 and the second repeating unit of Formula 2. In an implementation, when the brush polymer for a photoresist is included in the photoresist composition or film used in the photolithography process, the brush polymer for a photoresist may be segregated from the linear polymer, and may be present in an upper surface of the photoresist film due to a difference in entropy between the brush polymer for a photoresist and other linear polymers included in the photoresist film. The hydrophilization of a surface of the photoresist film may be induced. As a result, the causes of defects that could otherwise occur when the surface of the photoresist film is hydrophobic may be eliminated during a process of developing the photoresist film.

A photoresist composition according to embodiments may include, e.g., a brush polymer for a photoresist, a chemically amplified polymer, a photoacid generator (PAG), and a solvent. The brush polymer for a photoresist may include a core and a plurality of side polymer chains. The plurality of side polymer chains may be bonded to the core and extend from the core to form a bottle-brush polymer or a star-brush polymer along with the core.

The brush polymer for a photoresist may include the brush polymer for photoresist according to the embodiments described above. In an implementation, the brush polymer for photoresist may have a structure represented by, e.g., Formula 3, Formula 4, Formula 5, or Formula 6.

In an implementation, in the photoresist composition according to the embodiments, the brush polymer for photoresist may be included in an amount of, e.g., about 1% to about 15% by weight, or about 5% to about 10% by weight, based on a total weight of the chemically amplified polymer.

In the photoresist composition according to the embodiments, the chemically amplified polymer may include a polymer including a repeating unit of which solubility in a developer may be changed by the action of an acid. The chemically amplified polymer may be a block copolymer or a random copolymer. In an implementation, the chemically amplified polymer may include positive-type photoresist. The positive-type photoresist may be, e.g., a krypton fluoride (KrF) excimer laser (248 nm) resist, an argon fluoride (ArF) excimer laser (193 nm) resist, a fluorine ($F_2$) excimer laser (157 nm) resist, or a EUV (13.5 nm) resist.

In an implementation, the chemically amplified polymer may include a repeating unit, which decomposes by the action of an acid and increases solubility in an alkali developer. In an implementation, the chemically amplified polymer may include a repeating unit, which decomposes by the action of an acid and generates phenolic acid or a BrØnsted acid corresponding to the phenolic acid. In an implementation, the chemically amplified polymer may include a third repeating unit, which is derived from hydroxystyrene or derivatives thereof. The derivatives of hydroxystyrene may include hydroxystyrenes in which a hydrogen atom at an a site is substituted with a C1 to C5 alkyl group or a C1 to C5 halogenated alkyl group, and derivatives thereof. In an implementation, the third repeating unit may be derived from, e.g., 3-hydroxystyrene, 4-hydroxystyrene, 5-hydroxy-2-vinylnaphtalene, or 6-hydroxy-2-vinylnaphtalene.

In an implementation, the chemically amplified polymer may have a structure in which the third repeating unit derived from hydroxystyrene or the hydroxystyrene derivative is copolymerized with at least one fourth repeating unit having an acid-labile protecting group. The at least one fourth repeating unit may include, e.g., a (meth)acrylate polymer. In an implementation, the at least one fourth repeating unit may include, e.g., polymethylmethacrylate (PMMA), poly(t-butylmethacrylate), poly(methacrylic acid), poly(norbornylmethacrylate), or a binary or ternary copolymer of repeating units of the (meth)acrylate-based polymers.

In an implementation, the chemically amplified polymer may include a blend of a first polymer having the third repeating unit and a second polymer having the at least one fourth repeating unit.

In an implementation, the acid-labile group, which may be included in the at least one fourth repeating unit, may include, e.g., tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-buthoxycarbonylmethyl, methoxymethyl, ethoxymethyl, trimethoxysilyl, or a triethoxysilyl group.

In an implementation, the chemically amplified polymer may further include, e.g., a fifth repeating unit having an acrylate derivative substituent including a hydroxyl group (—OH), a sixth repeating unit having a protecting group substituted with fluorine, or a seventh repeating unit, which is derived from dihydroxystyrene or derivatives thereof.

The chemically amplified polymer may have a weight-average molecular weight of, e.g., about 1,000 to about 500,000. In the photoresist composition, the chemically amplified polymer may be included in an amount of, e.g., about 1% to about 25% by weight, based on a total weight of the photoresist composition.

In the photoresist composition according to the embodiments, the PAG may generate acid when exposed to, e.g., a KrF excimer laser (248 nm), an ArF excimer laser (193 nm), an F2 excimer laser (157 nm), or an EUV laser (13.5 nm). The PAG may include a material that generates a relatively strong acid having a pKa of about −20 or more and less than about 1 in response to the exposure. The PAG may include, e.g., triarylsulfonium salts, diaryliodonium salts, sulfonates, or a mixture thereof In an implementation, the PAG may include, e.g., triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or a mixture thereof.

In an implementation, in the photoresist composition according to the embodiments, the PAG may be included in an amount of, e.g., about 0.1% to about 5.0% by weight, based on a total weight of the chemically amplified polymer.

In an implementation, the photoresist composition according to the embodiments may further include a base quencher.

When an acid generated from the PAG included in the photoresist composition according to the embodiments diffuses into a non-exposed area of a photoresist film, the base quencher may include a compound capable of trapping the acid in the non-exposed area of the photoresist film. By including the base quencher in the photoresist composition according to the embodiments, a diffusion rate of the acid may be inhibited.

In an implementation, the base quencher may include, e.g., primary aliphatic amine, secondary aliphatic amine, tertiary aliphatic amine, aromatic amine, heterocyclic amine, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, amides, imides, carbamates, or ammonium salts. In an implementation, the base quencher may include, e.g., triethanol amine, triethyl amine, tributyl amine, tripropyl amine, hexamethyl disilazan, aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, or a combination thereof.

In an implementation, the base quencher may include a photo-decomposable base. The photo-decomposable base may include a compound, which generates acid in response to exposure and neutralizes the acid before exposure. The photo-decomposable base may lose ability to trap the acid when decomposed due to exposure. Accordingly, when a partial region of a photoresist film that is formed using a chemically amplified photoresist composition including the base quencher including the photo-decomposable base is exposed, the photo-decomposable base may lose alkalinity in an exposed area of the photoresist film, while the photo-decomposable base may trap acid in a non-exposed area of the photoresist film to inhibit the diffusion of the acid from the exposed area into the non-exposed area.

The photo-decomposable base may include a carboxylate or sulfonate salt of a photo-decomposable cation. In an implementation, the photo-decomposable cation may form a complex with an anion of C1 to C20 carboxylic acid. The carboxylic acid may include, e.g., formic acid, acetic acid, propionic acid, tartaric acid, succinic acid, cyclohexylcarboxylic acid, benzoic acid, or salicylic acid.

In an implementation, in the photoresist composition according to the embodiments, the base quencher may be included in an amount of, e.g., about 0.01% to about 5.0% by weight, based on a total weight of the chemically amplified polymer.

In the photoresist composition according to the embodiments, the solvent may include an organic solvent. In an implementation, the solvent may include, e.g., an ether, an alcohol, a glycol ether, an aromatic hydrocarbon compound, a ketone, or an ester. In an implementation, the solvent may include, e.g., ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethylether, propylene glycol monomethyl ether acetate, propylene glycol monoethyl ether, propylene glycol monoethyl ether acetate, propylene glycol propylether acetate, propylene glycol monobutyl ether, propylene glycol monobutyl ether acetate, toluene, xylene, methyl ethyl ketone, cyclopentanone, cyclohexanone, 2-hydroxypropionate ethyl, 2-hydroxy-2-methylpropionate ethyl, ethyl ethoxyacetate, ethyl hydroxyacetate, 2-hydroxy-3-methylbutanoate methyl, 3-methoxypropionate methyl, 3-methoxypropionate ethyl, 3-ethoxypropionate ethyl, 3-ethoxypropionate methyl, methyl pyruvate, ethyl pyruvate, ethyl acetate, butyl acetate, ethyl lactoate, or butyl lactoate. The solvents may be used alone or in combination of at least two thereof. In an implementation, the amount of the solvent in the photoresist composition may be adjusted so that a solid content of the photoresist composition may range from, e.g., about 3% to about 20% by weight.

In an implementation, the photoresist composition according to the embodiments may further include a surfactant.

In an implementation, the surfactant may include, e.g., fluoroalkyl benzene sulfonate, fluoroalkyl carboxylate, fluoroalkyl polyoxyethylene ether, fluoroalkyl ammonium iodide, fluoroalkyl betaine, fluoroalkyl sulfonate, diglycerin tetrakis(fluoroalkyl polyoxyethylene ether), fluoroalkyl trimethylammonium salt, fluoroalkyl amino sulfonate, polyoxyethylene nonylphenyl ether, polyoxyethylene octylphenyl ether, polyoxyethylene alkyl ether, polyoxyethylene lauryl ether, polyoxyethylene oleyl ether, polyoxyethylene tridecyl ether, polyoxyethylene cetyl ether, polyoxyethylene stearyl ether, polyoxyethylene laurate, polyoxyethylene oleate, polyoxyethylene stearate, polyoxyethylene laurylamine, sorbitanlaurate, sorbitanpalmitate, sorbitanstearate, sorbitan oleate, sorbitan fatty acid ester, polyoxyethylene sorbitanlaurate, polyoxyethylene sorbitanpalmitate, polyoxyethylene sorbitanstearate, polyoxyethylene sorbitan oleate, polyoxyethylene naphthyl ether, alkylbenzene sulfonate, or alkyldiphenyl ether disulfonate. In an implementation, the surfactant may be included in an amount of, e.g., about 0.001% to about 0.1% by weight, based on the total weight of the chemically amplified polymer.

In an implementation, the photoresist composition according to the embodiments may further include, e.g., a pigment, a preservative, an adhesion promoter, a coating aid, a plasticizer, a surface modifying agent, or a dissolution inhibitor.

A photoresist composition according to embodiments may include the brush polymer for a photoresist, which includes a core and a plurality of side polymer chains. The plurality of side polymer chains may be bonded to the core and extend from the core to form a bottle-brush polymer or a star-brush polymer along with the core. In a photolithography process using the photoresist composition according to the embodiments, after the photoresist film is formed from the photoresist composition, the brush polymer for a photoresist may be present on or at an upper surface of the photoresist film, and thus, the hydrophilization of a surface of the photoresist film may be induced. Accordingly, after the photoresist film is exposed, solubility in DIW may be improved during a pre-wetting process using DIW, and the efficiency of a process of developing the photoresist film may be increased. Therefore, when a photolithography process for manufacturing an integrated circuit (IC) is performed by using the photoresist composition according to the embodiments, sufficient dissolution contrast for a developer between the exposed area and the non-exposed area of the photoresist film may be ensured to improve resolution. In addition, by manufacturing an IC device by using a photoresist composition according to an embodiment, the dimensional precision of a pattern required for the IC device may be improved, and the productivity of a process of manufacturing the IC device may be increased.

Hereinafter, a method of manufacturing an IC device, according to an example embodiment, will be described.

Figure 3:
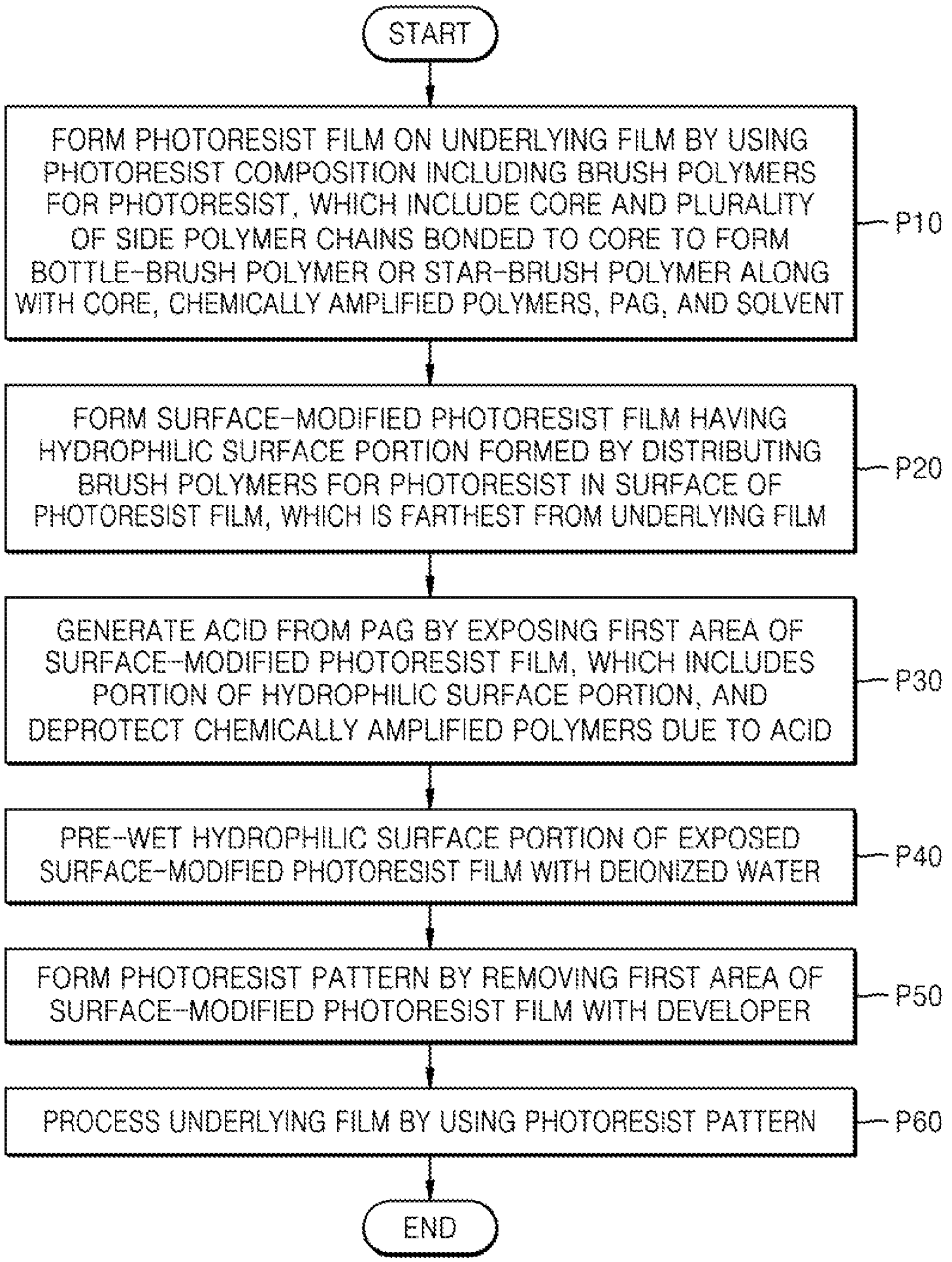
FIG. 3 is a flowchart of a method of manufacturing an integrated circuit (IC) device, according to embodiments.

FIG. 3 is a flowchart of a method of manufacturing an IC device, according to embodiments. FIGS. 4A to 4F are cross-sectional views of stages in a method of manufacturing an IC device, according to embodiments.

Figure 4A:
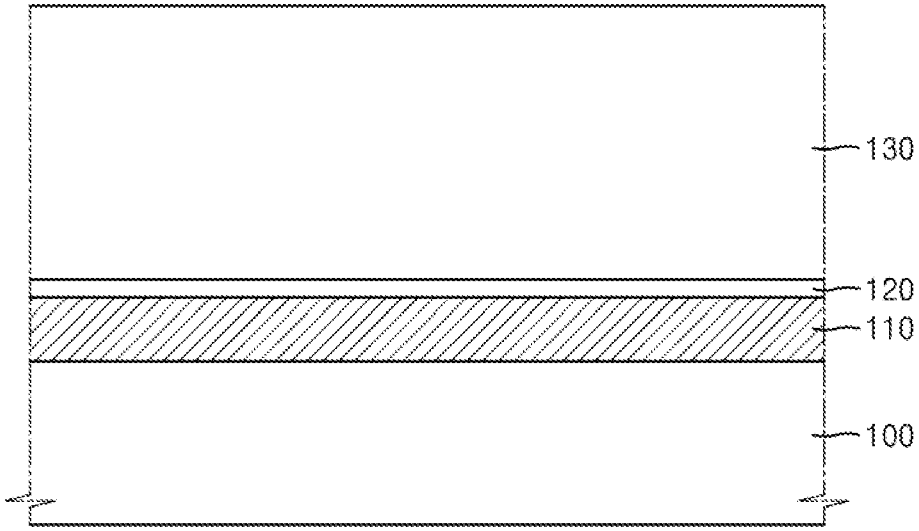
FIGS. 4A to 4F are cross-sectional views of stages in a method of manufacturing an IC device, according to embodiments.

Referring to FIGS. 3 and 4A, in process P10 of FIG. 3, a photoresist film 130 may be formed on an underlying film. The underlying film may include a substrate 100 and a feature layer 110 on the substrate 100.

The substrate 100 may include a semiconductor substrate. In an implementation, the substrate 100 may include an elemental semiconductor material, e.g., silicon (Si) or germanium (Ge), or a compound semiconductor material, e.g., silicon germanium (SiGe), silicon carbide (SiC), gallium arsenide (GaAs), indium arsenide (InAs), or indium phosphide (InP).

The feature layer 110 may include an insulating film, a conductive film, or a semiconductor film. In an implementation, the feature layer 110 may include a metal, an alloy, a metal carbide, a metal nitride, a metal oxynitride, a metal oxycarbide, a semiconductor, polysilicon, oxide, nitride, oxynitride, or a combination thereof In an implementation, as shown in FIG. 4A, before the photoresist film 130 is formed on the feature layer 110, a developable bottom anti-reflective coating (DBARC) film 120 may be formed on the feature layer 110. In this case, the photoresist film 130 may be formed on the DBARC film 120. The DBARC film 120 may help control diffuse reflection of light from a light source used during an exposure process for manufacturing an IC device or absorb reflected light from the feature layer 110 located thereunder. In an implementation, the DBARC film 120 may include an organic anti-reflective coating (ARC) material for a KrF excimer laser, an ArF excimer laser, or another suitable light source. In an implementation, the DBARC film 120 may include an organic component having a light-absorbing structure. The light-absorbing structure may include, e.g., at least one benzene ring or a hydrocarbon compound in which benzene rings are fused. In an implementation, the DBARC film 120 may be have a thickness of, e.g., about 20 nm to about 100 nm. In an implementation, the DBARC film 120 may be omitted.

To form the photoresist film 130, a photoresist composition including brush polymers for a photoresist, a chemically amplified polymer, a PAG, and a solvent may be coated on the underlying film. The brush polymers for a photoresist may include a core and a plurality of side polymer chains. The plurality of side polymer chains may be bonded to the core and extend from the core to form a bottle-brush polymer or a star-brush polymer along with the core. In an implementation, the photoresist composition may further include a base quencher.

In an implementation, the brush polymers for a photoresist in the photoresist composition may include a bottle-brush polymer, a star-brush polymer, or a combination thereof In an implementation, the brush polymers for photoresist may include the brush polymer 10 for photoresist, which has the structure shown in FIG. 1, the brush polymer 20 for photoresist, which has the structure shown in FIG. 2, or a combination thereof. Detailed descriptions of the brush polymers for photoresist and the photoresist composition may be the same as given above.

To form the photoresist film 130, the process of coating the underlying film with the photoresist composition may be performed using, e.g., a spin coating process, a spray coating process, and a dip coating process. A thickness of the photoresist film 130 may be several times to several hundred times a thickness of the DBARC film 120. In an implementation, the photoresist film 130 may be formed to a thickness of, e.g., about 100 nm to about 6 μm.

Figure 4B:
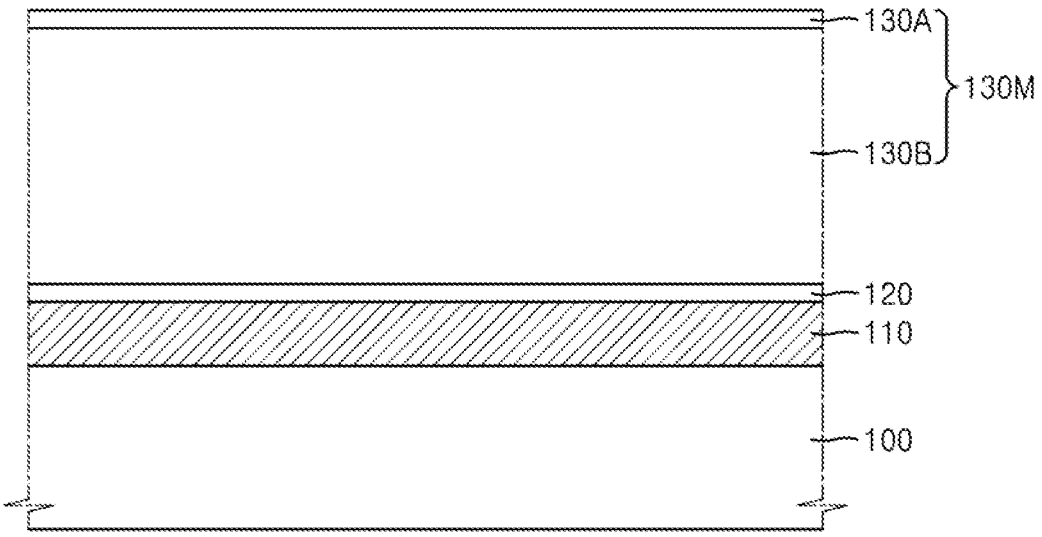

Referring to FIGS. 3 and 4B, in process P20 of FIG. 3, a surface-modified photoresist film 130M having a hydrophilic surface portion 130A and an inner portion 130B may be formed from the photoresist film 130 included in the resultant structure of FIG. 4A.

The brush polymers for a photoresist, which are included in the photoresist composition in the photoresist film 130 of the resultant structure of FIG. 4A, may be segregated from the chemically amplified polymers and distributed in or at a surface of the photoresist film 130, which is farthest from (e.g., distal to) the underlying film, and thus, the hydrophilic surface portion 130A of the surface-modified photoresist film 130M may be formed.

In an implementation, at least a portion of the hydrophilic surface portion 130A of the surface-modified photoresist film 130M may be formed within several seconds to several hours after the photoresist film 130 is formed by coating the photoresist composition according to the embodiments on the DBARC film 120. In an implementation, at least a portion of the hydrophilic surface portion 130A of the surface-modified photoresist film 130M may be formed after forming the photoresist film 130 by coating the photoresist composition according to the embodiments on the DBARC film 120 and then performing a soft bake process on the photoresist film 130. In an implementation, the soft bake process may be performed, e.g., at a temperature of about 80° C. to about 300° C. for about 10 seconds to about 100 seconds.

When the photoresist composition used to form the photoresist film 130 includes the brush polymer for a photoresist, according to the embodiments described above, along with the chemically amplified polymer, the brush polymer for a photoresist may be segregated from the chemically amplified polymer and move to an upper surface of the photoresist film 130 due to a difference in entropy between the brush polymer for a photoresist and the chemically amplified polymer. As a result, the hydrophilic surface portion 130A including the brush polymers for a photoresist may be formed at a side of the upper surface of the photoresist film 130. In an implementation, each of the plurality of side polymer chains included in the brush polymers for photoresist may include a first repeating unit of Formula 1, and $R^2$ included in the first repeating unit may be, e.g., a C3 to C30 fluoroaliphatic group including a hydroxyl group. A fluorine-containing group of $R^2$ may have a property of easily integrating at an interface between a hydrophobic atmosphere (e.g., the air) and a liquid (e.g., a solvent included in the photoresist composition). This may be due to the attraction of the first repeating unit including the fluorine-containing group to the air side because the first repeating unit including the fluorine-containing group has a higher hydrophobicity than the chemically amplified polymers. Therefore, the brush polymer for a photoresist in the photoresist film 130 may be integrated in or congregate at the surface of the photoresist film 130, which is farthest from the underlying film. Accordingly, in the surface-modified photoresist film 130M obtained from the photoresist film 130, a distribution in the concentration of the brush polymer for a photoresist in a direction perpendicular to a main surface of the substrate 100 may be highest in the hydrophilic surface portion 130A, which is close to an outer surface of the surface-modified photoresist film 130M.

Figure 5:
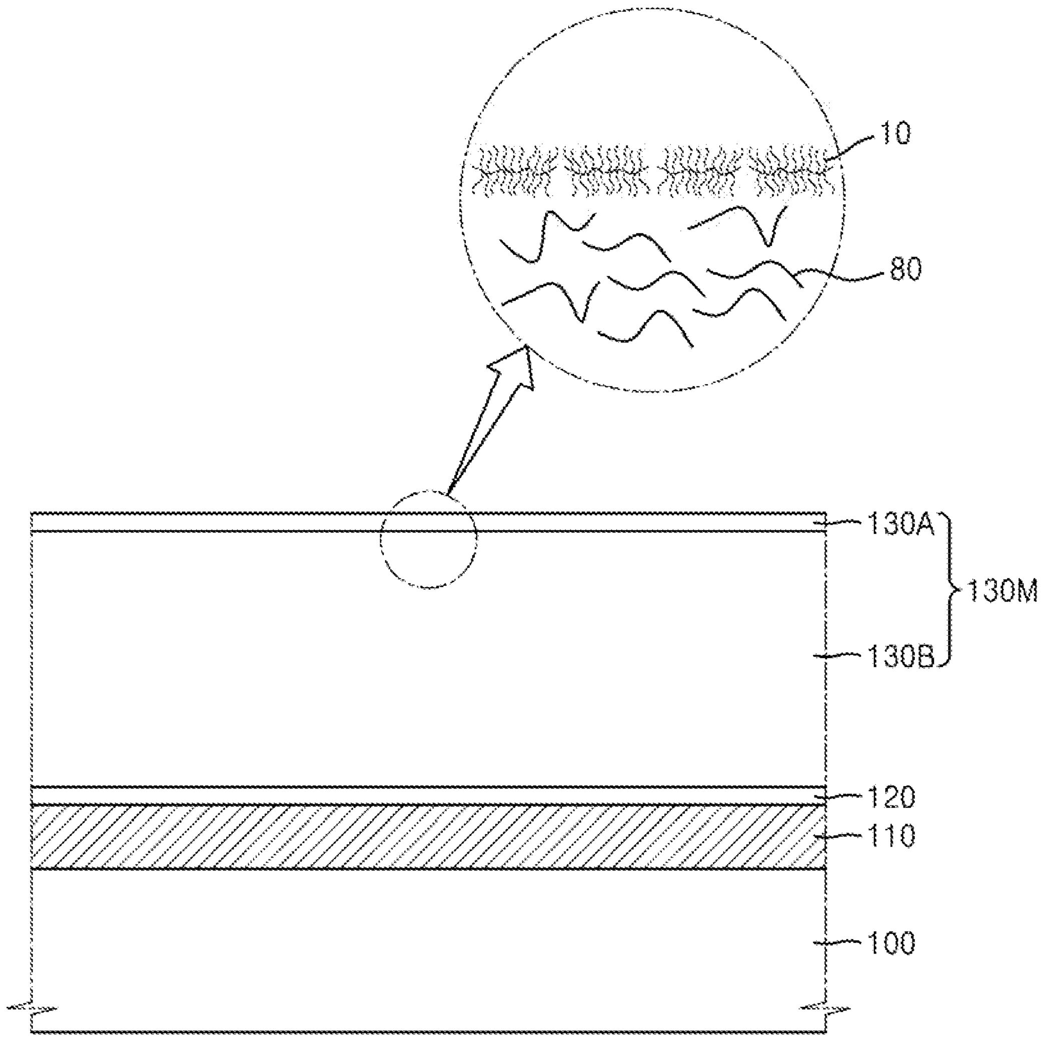
FIGS. 5 to 7 are cross-sectional views of a configuration of each of a hydrophilic surface portion and an inner portion, which are included in a surface-modified photoresist film formed using a method of manufacturing an IC device, according to embodiments.

FIG. 5 is a cross-sectional view of a configuration of each of the hydrophilic surface portion 130A and the inner portion 130B, which are included in the surface-modified photoresist film 130M, according to an example embodiment.

Referring to FIG. 5, the photoresist composition used to form the photoresist film 130 may include a plurality of brush polymers 10 for a photoresist, which includes a bottle-brush polymer as shown in FIG. 1. In an implementation, in the surface-modified photoresist film 130M, the plurality of brush polymers 10 for a photoresist may be integrated in or concentrated at the hydrophilic surface portion 130A, and a plurality of chemically amplified polymers 80 may be in the inner portion 130B of the surface-modified photoresist film 130M.

Figure 6:
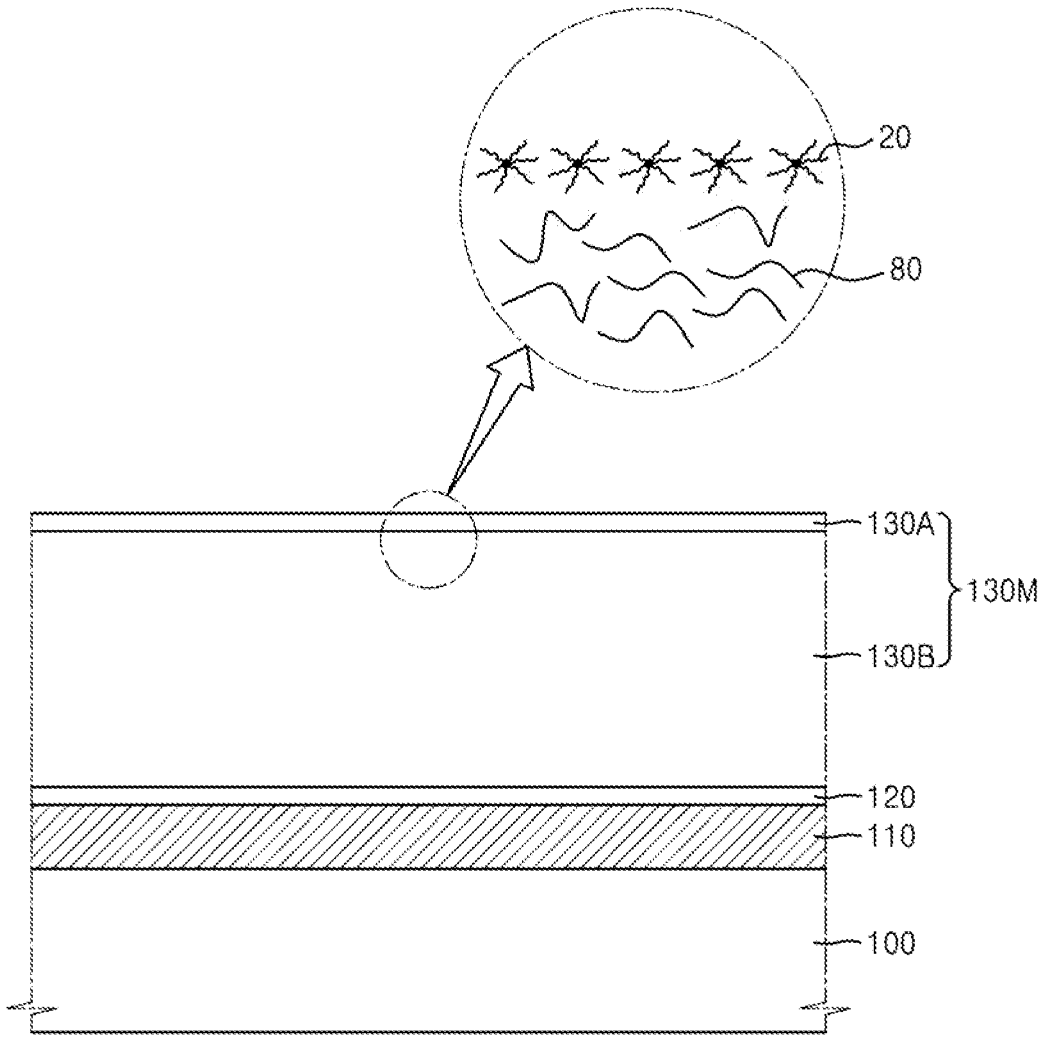

FIG. 6 is a cross-sectional view of a configuration of each of the hydrophilic surface portion 130A and the inner portion 130B, which are included in the surface-modified photoresist film 130M, according to an example embodiment.

Referring to FIG. 6, the photoresist composition used to form the photoresist film 130 may include a plurality of brush polymers 20 for a photoresist, which includes a star-brush polymer as shown in FIG. 2. In an implementation, in the surface-modified photoresist film 130M, the plurality of brush polymers 20 for photoresist may be integrated in or concentrated at the hydrophilic surface portion 130A, and a plurality of chemically amplified polymers 80 may be in the inner portion 130B of the surface-modified photoresist film 130M.

Figure 7:
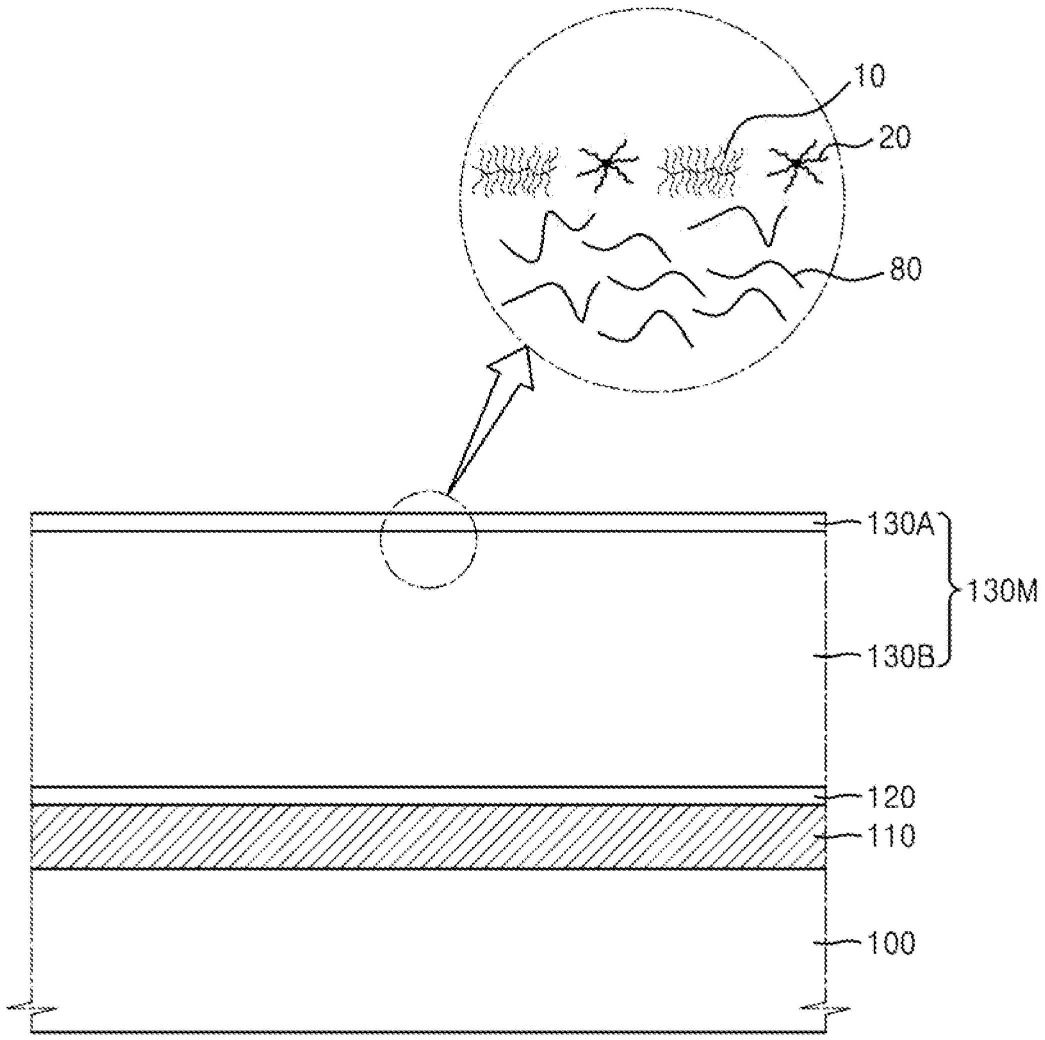

FIG. 7 is a cross-sectional view of each of a hydrophilic surface portion 130A and an inner portion 130B, which are in the surface-modified photoresist film 130M, according to an example embodiment.

Referring to FIG. 7, the photoresist composition used to form the photoresist film 130 may include a plurality of brush polymers 10 for a photoresist, which includes a bottle-brush polymer as shown in FIG. 1, and a plurality of brush polymers 20 for a photoresist, which includes a star-brush polymer as shown in FIG. 2. In an implementation, in the surface-modified photoresist film 130M, the plurality of brush polymers 10 and 20 for photoresist may be integrated in or concentrated at the hydrophilic surface portion 130A, and a plurality of chemically amplified polymers 80 may be in the inner portion 130B of the surface-modified photoresist film 130M.

Figure 4C:
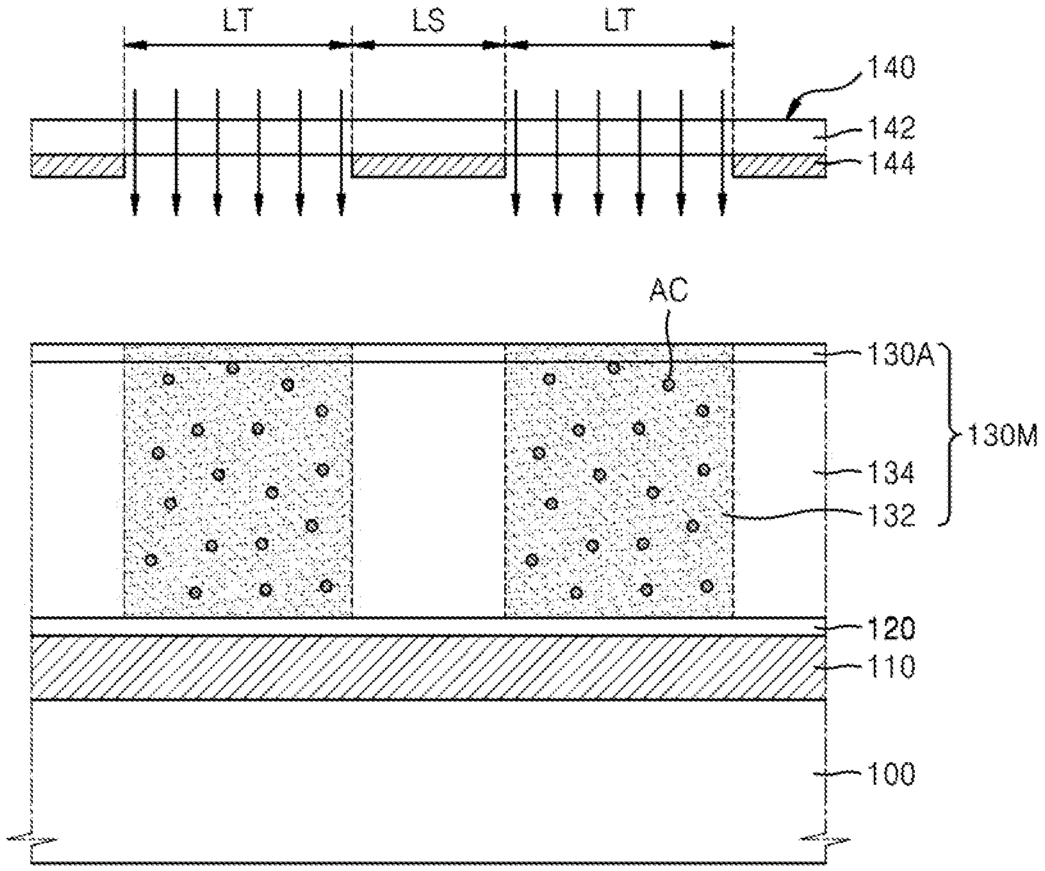

Referring to FIGS. 3 and 4C, in process P30, a first area 132 of the surface-modified photoresist film 130M, which includes a portion of each of the hydrophilic surface portion 130A and the inner portion 130B, may be exposed. Therefore, acid AC may be generated from the PAG in the first area 132 of the surface-modified photoresist film 130M and the chemically amplified polymers may be deprotected due to the plurality of acid AC.

In an implementation, to expose the first area 132 of the surface-modified photoresist film 130M, a photomask 140 having a plurality of light-shielding areas LS and a plurality of light-transmitting areas LT may be arranged at a predetermined position on the photoresist film 130, and the first area 132 of the photoresist film 130 may be exposed through the plurality of light-transmitting areas LT of the photomask 140. The first area 132 of the surface-modified photoresist film 130M may be exposed using, e.g., a KrF excimer laser (248 nm), an ArF excimer laser (193 nm), an $F_2$ excimer laser (157 nm), or an EUV laser (13.5 nm).

The photomask 140 may include a transparent substrate 142 and a plurality of light-shielding patterns 144 on the transparent substrate 142 in the plurality of light-shielding areas LS. The transparent substrate 142 may include quartz. The plurality of light-shielding patterns 144 may include chromium (Cr). The plurality of light-transmitting areas LT may be defined by the plurality of light-shielding patterns 144.

In an implementation, an annealing process may be performed to diffuse the acid AC in the first area 132 of the surface-modified photoresist film 130M. In an implementation, the resultant structure, which is obtained after the first area 132 of the surface-modified photoresist film 130M is exposed in process P30 of FIG. 3, may be annealed at a temperature of, e.g., about 50° C. to about 150° C. Therefore, at least some of the acid AC may be diffused in the first area 132 of the surface-modified photoresist film 130M so that the acid AC may be relatively uniformly distributed in the first area 132 of the surface-modified photoresist film 130M. The annealing process may be performed for about 10 seconds to about 100 seconds. In an implementation, the annealing process may be performed at a temperature of about 100° C. for about 60 seconds.

In an implementation, an additional annealing process may not be performed to diffuse the acid AC in the first area 132 of the surface-modified photoresist film 130M. In this case, in process P30 of FIG. 3, during the exposing of the first area 132 of the surface-modified photoresist film 130M, the acid AC may be diffused in the first area 132 of the surface-modified photoresist film 130M without an additional annealing process.

As a result of the diffusion of the acid in the first area 132 of the surface-modified photoresist film 130M, an acid-labile group may be deprotected from chemically amplified polymers included in the surface-modified photoresist film 130M in the first area 132, and the first area 132 of the surface-modified photoresist film 130M may be changed to a state in which the first area 132 may be easily dissolved in an alkali developer.

When a base quencher is included in the surface-modified photoresist film 130M, in a second area 134 that is a non-exposed area, the base quencher may act as a quenching base to neutralize acid that may have been undesirably diffused from the first area 132 into the second area 134.

Figure 4D:
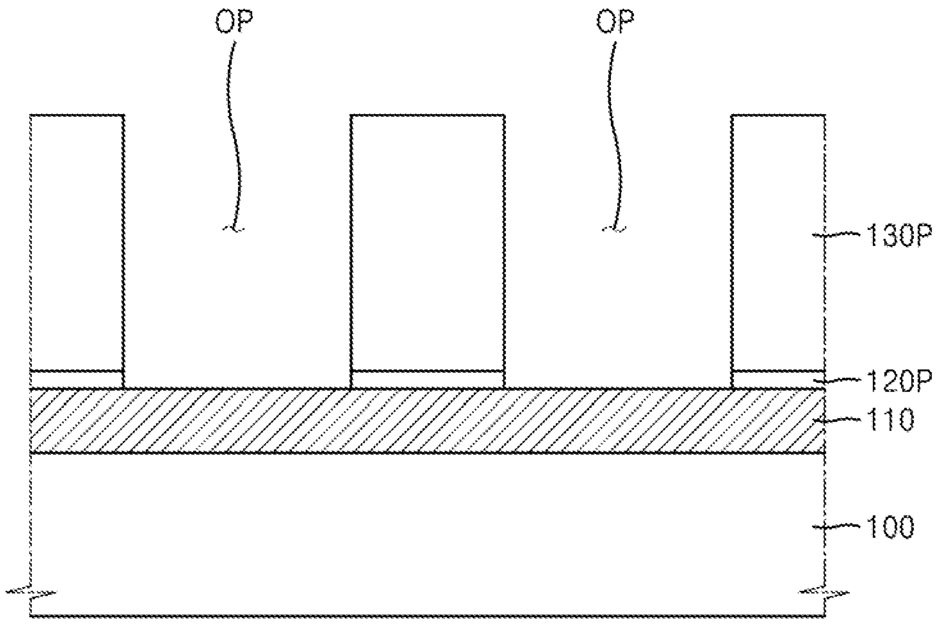

Referring to FIGS. 3 and 4D, in process P40 and process P50, the surface-modified photoresist film 130M, which is exposed, may be developed to form a photoresist pattern 130P including the second area 134, which is not exposed.

The process of developing the surface-modified photoresist film 130M, which is exposed, may include a process of pre-wetting, with DIW, the hydrophilic surface portion 130A (see FIG. 4C) of the surface-modified photoresist film 130M, which is exposed, according to process P40 of FIG. 3 and a process of removing, with a developer, the first area 132 of the surface-modified photoresist film 130M, which is exposed, according to process P50 of FIG. 3.

In the process of pre-wetting, with DIW, the hydrophilic surface portion 130A (see FIG. 4C) of the surface-modified photoresist film 130M, which is exposed, according to process P40 of FIG. 3, brush polymers for a photoresist, according to embodiments, (e.g., the plurality of brush polymers 10 for a photoresist, which include the bottle-brush polymer shown in FIG. 1, the plurality of brush polymers 20 for a photoresist, which include the star-brush polymer shown in FIG. 2, or a combination thereof) may be integrated in or concentrated at the hydrophilic surface portion 130A. Thus, the solubility of the hydrophilic surface portion 130A in DIW may be improved during the pre-wetting process.

As a result, in the process of removing, with the developer, the first area 132 of the surface-modified photoresist film 130M, which is exposed, according to process P50 of FIG. 3, the first area 132 of the surface-modified photoresist film 130M, which is exposed, may be cleanly removed. Also, a pattern having a low LER or a low line width roughness (LWR) may be obtained in a final pattern, which is to be formed in a subsequent process.

As shown in FIG. 4D, the photoresist pattern 130P may include a plurality of openings OP. After the photoresist pattern 130P is formed, a portion of the DBARC film 120, which is exposed through the plurality of openings OP, may be removed to form a DBARC pattern 120P.

In an implementation, to develop the photoresist film 130, an alkali developer may be used. The alkali developer may include 2.38% by weight of a tetramethyl ammonium hydroxide (TMAH) solution.

Figure 4E:
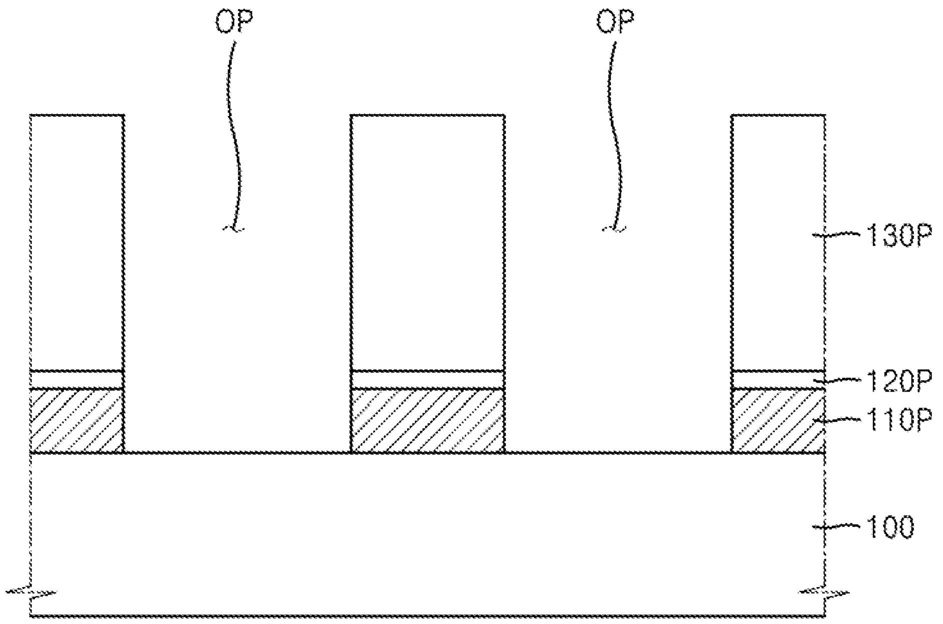

Referring to FIGS. 3 and 4E, in process P60, an underlying film may be processed using the photoresist pattern 130P in the resultant structure of FIG. 4D.

To process the underlying film, various processes including, e.g., a process of etching the feature layer 110 exposed through the opening OP of the photoresist pattern 130P, a process of implanting impurity ions into the feature layer 110, a process of forming an additional film on the feature layer 110 through the opening OP, or a process of modifying a portion of the feature layer 110 through the opening OP may be performed. FIG. 4E illustrates a process of forming a feature pattern 110P by etching the feature layer 110 exposed through the opening OP as an example of processing the underlying film.

In an implementation, the process of forming the feature layer 110 may be omitted from the process described with reference to FIG. 4A. In this case, a substrate 100 may be processed using the photoresist pattern 130P instead of the process P60 of FIG. 3 and the process described with reference to FIG. 4E. In an implementation, various processes including, e.g., a process of etching a portion of the substrate 100 using the photoresist pattern 130P, a process of implanting impurity ions into a partial region of the substrate 100, a process of forming an additional film on the substrate 100 through the opening OP, or a process of modifying a portion of the substrate 100 through the opening OP may be performed.

Figure 4F:
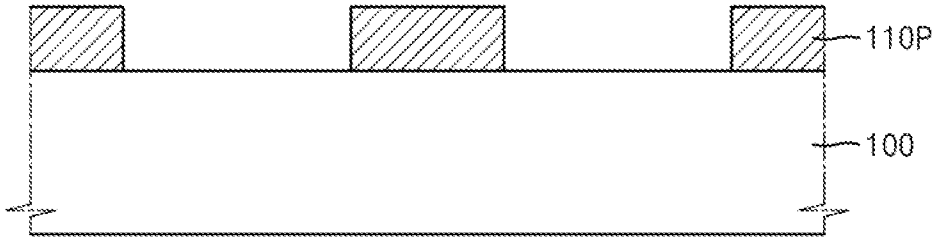

Referring to FIG. 4F, in the resultant structure of FIG. 4E, the photoresist pattern 130P and the DBARC pattern 120P, which remain on the feature pattern 110P, may be removed. The photoresist pattern 130P and the DBARC pattern 120P may be removed using an ashing process and a strip process.

In the method of manufacturing an IC device, which has been described with reference to FIGS. 3 and 4A to 4F, during a developing process for removing an exposed area of the photoresist film 130 obtained by using the photoresist composition according to the embodiment, the solubility of the hydrophilic surface portion 130A in DIW may be improved in a pre-wetting process using DIW. In addition, during a process of removing, with a developer, the first area 132 of the surface-modified photoresist film 130M, which is exposed, subsequently after the pre-wetting process, the first area 132 of the surface-modified photoresist film 130M, which is exposed, may be cleanly removed. Therefore, an LER and an LWR may be reduced in the photoresist pattern 130P obtained from the surface-modified photoresist film 130M to provide a high pattern fidelity. Accordingly, when subsequent processes are performed on the feature layer 110 or the substrate 100 using the photoresist pattern 130P, a dimensional precision may be improved by precisely controlling critical dimensions (CDs) of processing regions or patterns to be formed in the feature layer 110 or the substrate 100. Furthermore, a distribution in the CDs of the patterns to be embodied on the substrate 100 may be uniformly controlled, and the productivity of a process of manufacturing an IC device may be improved.

The following Examples are provided in order to highlight characteristics of one or more embodiments, but it will be understood that the Examples are not to be construed as limiting the scope of the embodiments. Further, it will be understood that the embodiments are not limited to the particular details described in the Examples.

Hereinafter, synthesis examples of brush polymers for photoresist, according to example embodiments, will be described. The following Synthesis Examples are provided to explain a process of synthesizing a brush polymer for photoresist, according to embodiments, but the embodiments are not limited thereto.

SYNTHESIS EXAMPLE 1

Synthesis of Polymer of Chemical Formula 3A

[Reaction Scheme 1A]

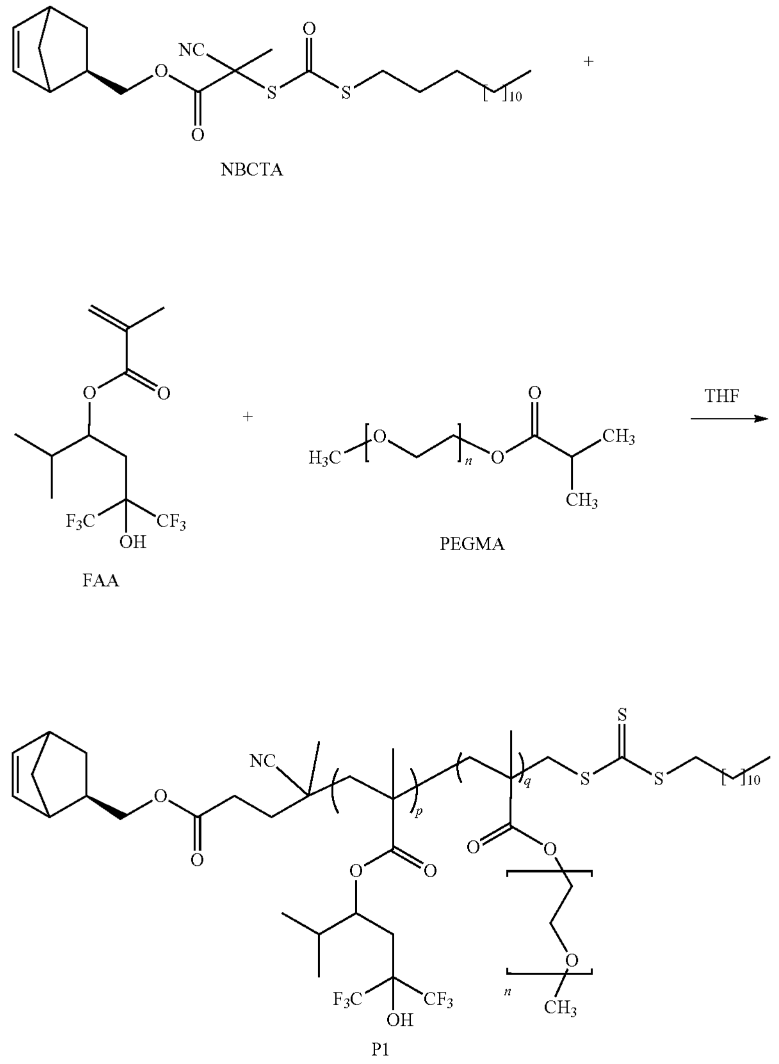

NBCTA

FAA

PEGMA

P1

0.3 mmol (152.67 mg) of NBCTA (((1S,2R,4S)-bicyclo[2.2.1]hept-5-en-2-yl)methyl-4-cyano-4-(((dodecylsulfanyl)carbonothioyl)-thio)-pentanoate), 15 mmol (4.834 g) of FAA (2-propenoic acid, 2-methyl-, 4,4,4-trifluoro-3-hydroxy-1-(1-methylethyl)-3-(trifluoromethyl)butyl ester), and 15 mmol (3.484 g) of PEGMA (poly(ethylene glycol) methyl ether methacrylate, n=3) were dissolved in tetrahydrofuran (THF). The concentration of FAA and PEGMA was set to about 50% by weight of the total solution. Thereafter, the obtained solution was stirred for about six hours under a nitrogen atmosphere at a temperature of about 80° C. The obtained product was precipitated in n-hexane three times and purified to obtain an intermediate product P1.

[Reaction Scheme 1B]

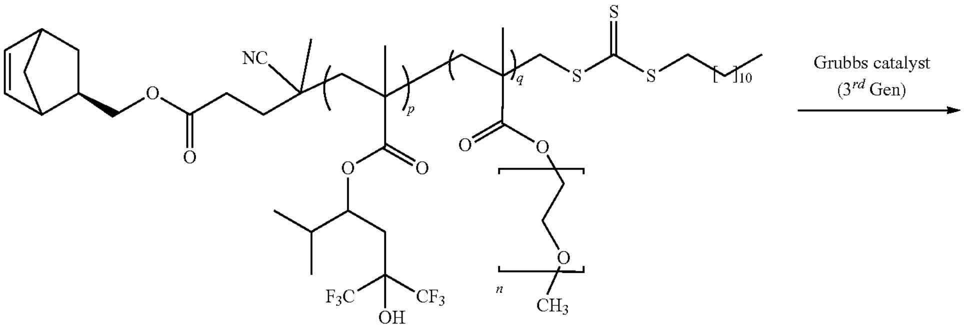

P1

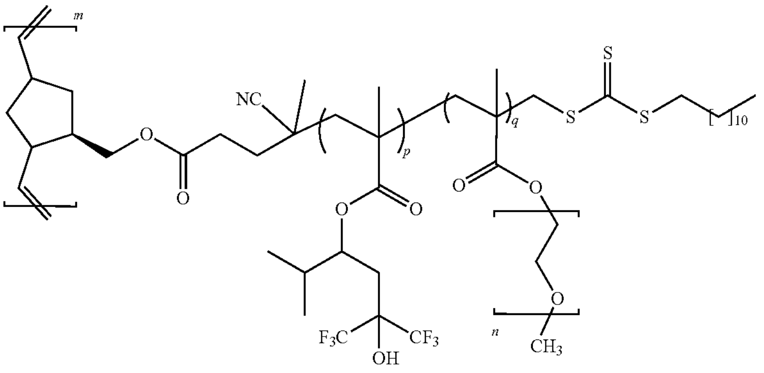

P2

0.025 mmol (0.022 g) of a 3rd-generation Grubbs catalyst was added to 0.5 mmol (about 3.5 g) of intermediate product P1, which was synthesized according to Reaction Scheme 1A, and THF was added to the obtained solution such that a concentration of the intermediate product P1 was about 50% by weight of the total solution. Thereafter, the obtained solution was stirred for 8 hours under a nitrogen atmosphere at ambient temperature, and the obtained product was precipitated in n-hexane 5 times and purified to obtain polymer P2 of Chemical formula 3A.

The 3rd-generation Grubbs catalyst had a structure of Chemical Formula 7:

[Chemical Formula 7]

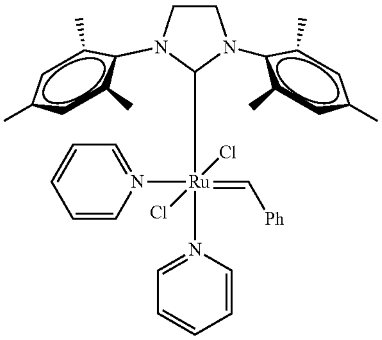

SYNTHESIS EXAMPLE 2

Synthesis of Polymer of Chemical Formula 4A

[Reaction Scheme 2A]

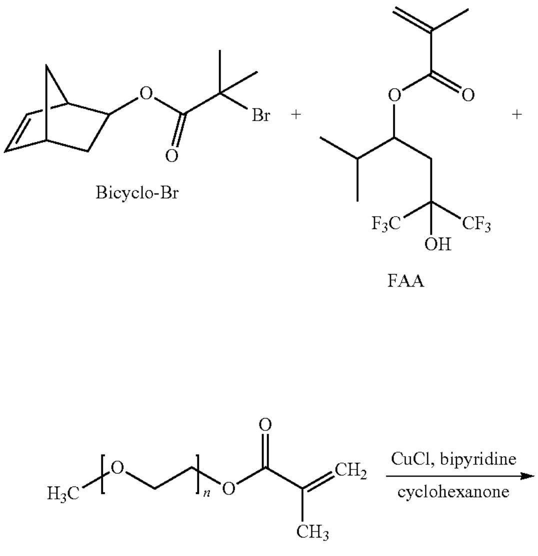

Bicyclo-Br

FAA

PEGMA

-continued

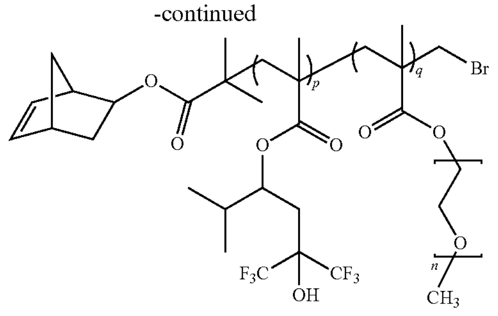

P3

0.5 mmol (129.57 mg) of Bicyclo-Br (bicyclo[2.2.1]hept-5-en-2-yl 2-bromo-2-methylpropanoate), 15 mmol (4.834 g) of FAA, 15 mmol (3.484 g) of PEGMA, 0.5 mmol (49.49 mg) of copper (I) chloride, and 0.5 mmol (78.09 mg) of 2,2'-bipyridine were dissolved in cyclohexanone. The concentration of FAA and PEGMA was set to about 50% by weight of the total solution. Thereafter, the obtained solution was stirred for about 4 hours under a nitrogen atmosphere at a temperature of about 55° C. The obtained product was precipitated in n-hexane three times and purified to obtain an intermediate product P3.

Figure 8:
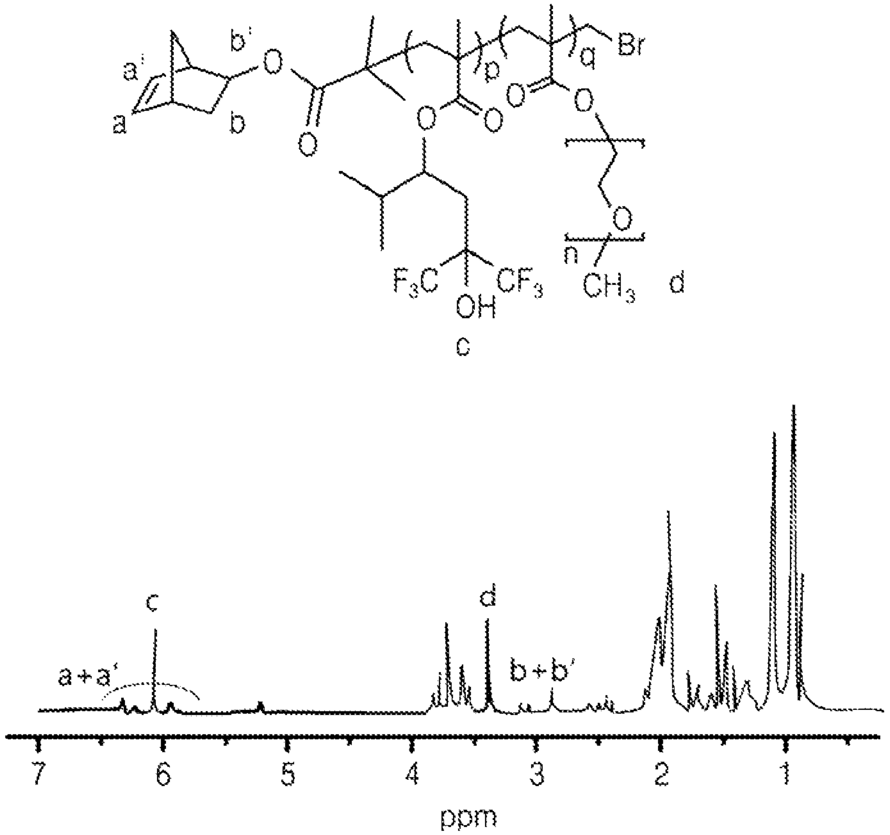
FIG. 8 shows a $^1H$ nuclear magnetic resonance (NMR) spectrum of an intermediate product obtained during a process of synthesizing a brush polymer for photoresist, according to embodiments.

FIG. 8 shows a $^1$H nuclear magnetic resonance (NMR) spectrum of the intermediate product P3. Data of the $^1$H NMR spectrum of the intermediate product P3 was as follows.

$^1$H NMR [600 MHz, $CDCl_3$, δ/ppm]: 2.8-3.1(m, 3H, —CH—CH—$CH_2$—CH— in bicyclo group), 3.48 (s, 3H, $CH_3$ end group of PEGMA), 6.1 (s, 1H, $C(CF_3)_2$—OH), 5.9-6.4(m, 2H, —CH—CH═CH—CH— in bicyclo group)

[Reaction Scheme 2B]

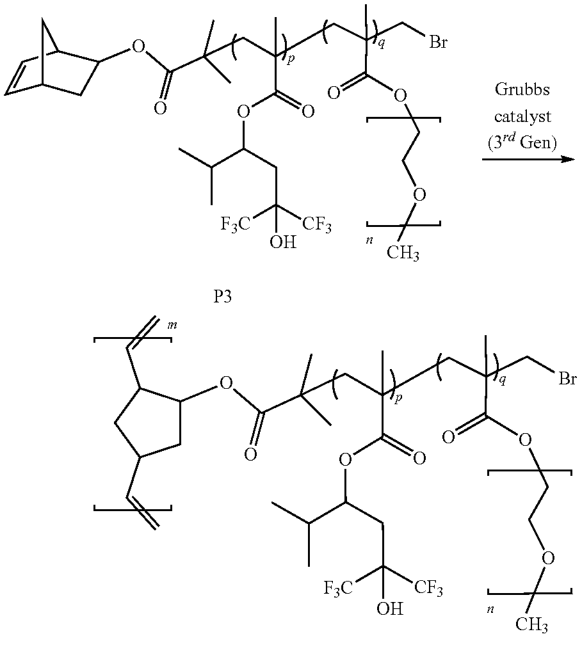

P3

P4

0.05 mmol (0.044 g) of a 3rd-generation Grubbs catalyst having the structure of Chemical Formula 7 was added to 0.5 mmol (about 4 g) of intermediate product P3, which was synthesized according to Reaction Scheme 2A, and cyclohexane was added to the obtained solution such that a concentration of the intermediate product P3 was about 50% by weight of the total solution. Thereafter, the obtained solution was stirred for 8 hours under a nitrogen atmosphere at ambient temperature, and the obtained product was precipitated in n-hexane 5 times and purified to obtain polymer P4 of Chemical Formula 4A.

Figure 9:
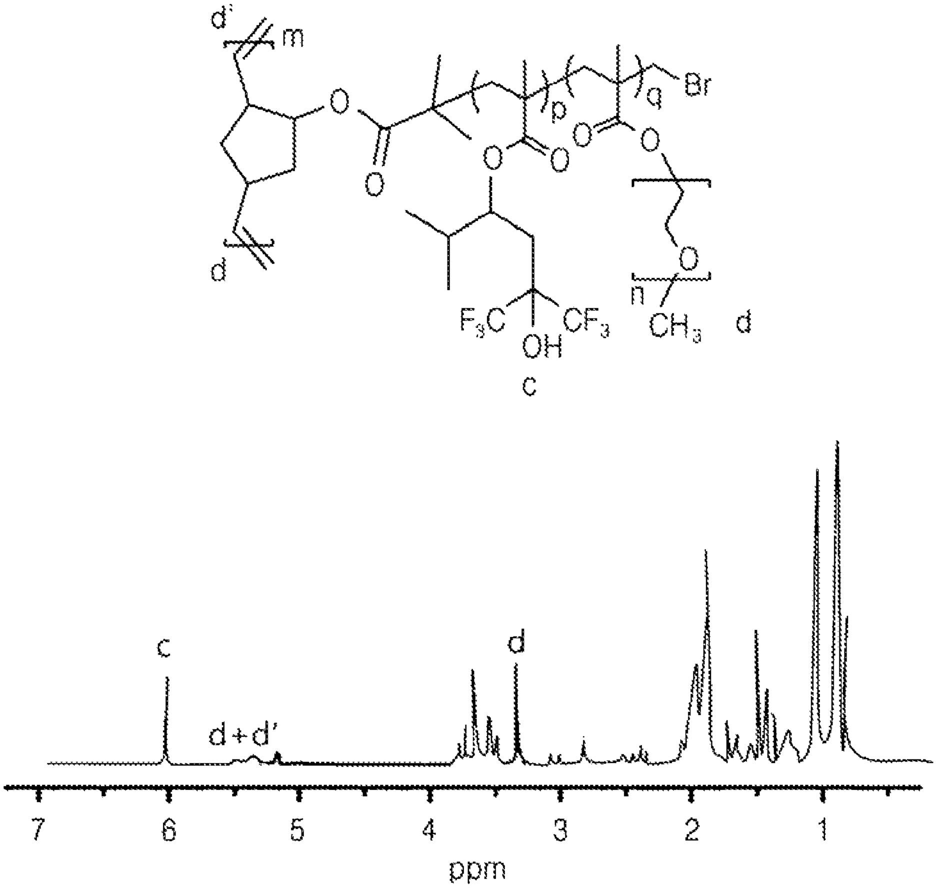
FIG. 9 shows a $^1H$ NMR spectrum of a brush polymer for photoresist, according to embodiments.

FIG. 9 shows a $^1$H NMR spectrum of the polymer P4 of Chemical formula 4A, which is a final product. Data of the $^1$H NMR spectrum of the polymer P4 was as follows.

$^1$H NMR [600 MHz, $CDCl_3$, δ/ppm]: 3.48 (s, 3H, $CH_3$ end group of PEGMA), 5.2-5.6 (m, 2H, alkene linkage of polymer main chain), 6.1 (s, 1H, $C(CF_3)_2$—OH)

SYNTHESIS EXAMPLE 3

Synthesis of Polymer of Chemical Formula 5A

[Reaction Scheme 3]

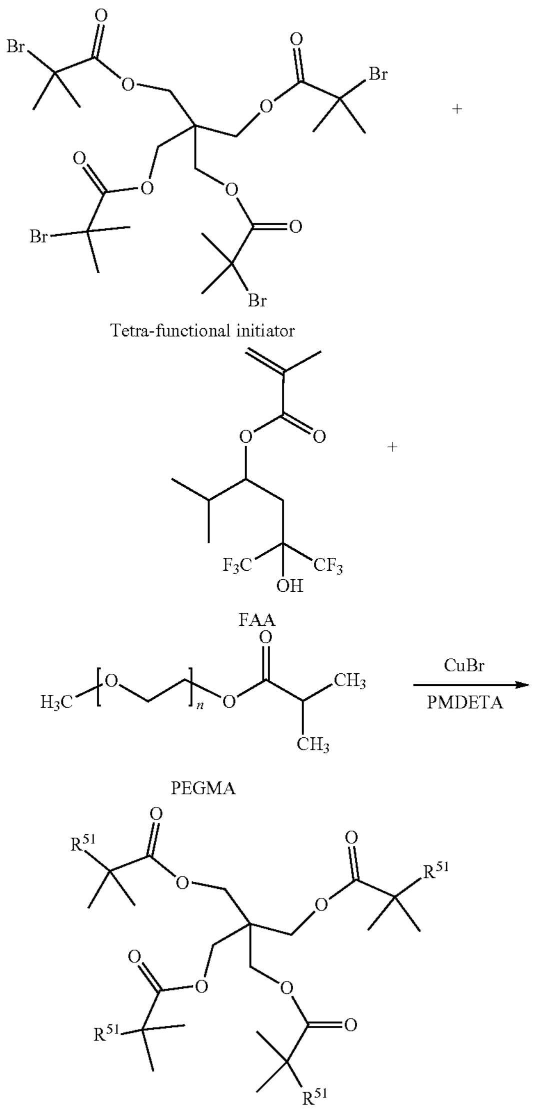

Tetra-functional initiator

FAA

PEGMA

-continued

R51 =

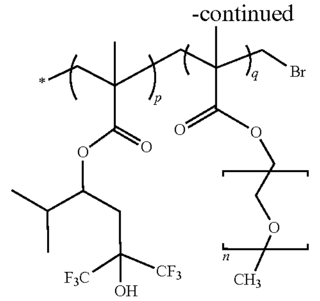

0.5 mmol (366.05 mg) of pentaerythritol tetrakis(2-bromoisobutyrate) serving as a tetra-functional initiator, 15 mmol (4.834 g) of FAA, 15 mmol (3.484 g) of PEGMA, 0.5 mmol (71.73 mg) of copper (I) bromide, and 0.05 mmol (86.65 mg) of N,N,N',N'',N''-pentamethyldiethylenetriamine (PMDETA) were dissolved in toluene such that the sum of concentrations of the reactants was about 30% by weight of the total solution. The obtained solution was stirred for about six hours under a nitrogen atmosphere at a temperature of about 55° C. The obtained product was precipitated in n-hexane three times and purified to obtain a polymer of Chemical Formula 5A.

SYNTHESIS EXAMPLE 4

Synthesis of Polymer of Chemical Formula 6A

[Reaction Scheme 4]

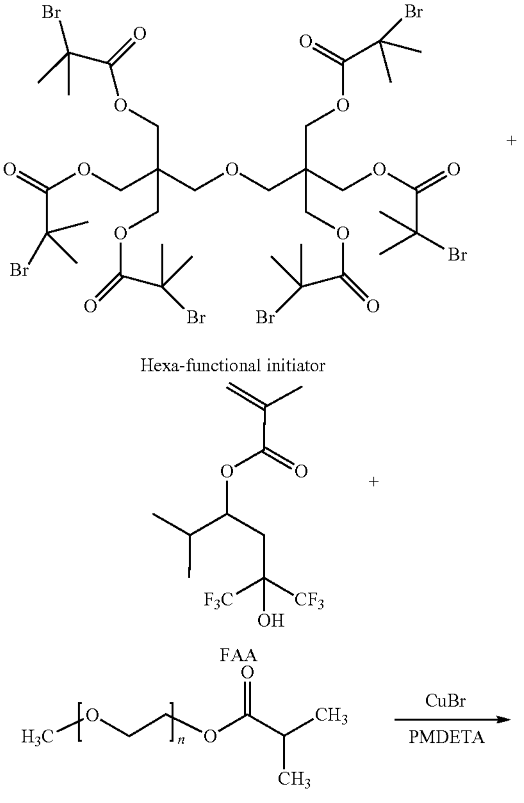

Hexa-functional initiator

FAA

PEGMA

-continued

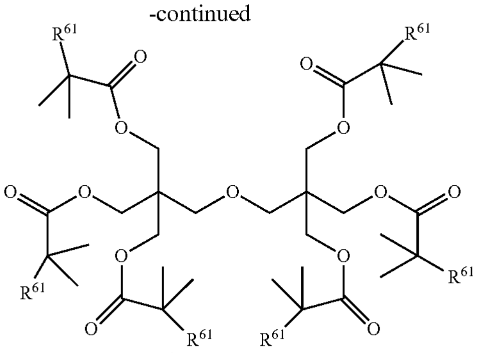

R61 =

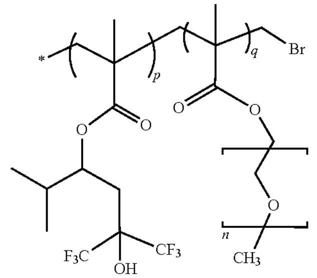

According to Reaction Scheme 4, a polymer of Chemical Formula 6A was obtained in a similar manner to Synthesis Example 3 except that a hexa-functional initiator was used instead of the tetra-functional initiator.

By way of summation and review, in a photolithography process for manufacturing an IC device, a technique may not only improve dissolution contrast for a developer between an exposed area and a non-exposed area of a photoresist film but also increase the efficiency of a developing process.

One or more embodiments may provide a bottle-brush polymer or a star-brush polymer.

One or more embodiments may provide a brush polymer for photoresist, which may help increase the efficiency of a process of developing an exposed photoresist film when the brush polymer for photoresist is added to a photoresist composition during a photolithography process for manufacturing an integrated circuit (IC) device.

One or more embodiments may provide a photoresist composition, which may help increase the efficiency of a developing process in a photolithography process for manufacturing an IC device.

One or more embodiments may provide a method of manufacturing an IC device, which may help improve the dimensional accuracy of a pattern to be formed by increasing the efficiency of a developing process in a photolithography process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A brush polymer for a photoresist, the brush polymer comprising a core and a plurality of side polymer chains, the plurality of side polymer chains being bonded to the core and extending from the core to form a bottle-brush polymer or a star-brush polymer, together with the core, wherein:

each of the plurality of side polymer chains includes a first repeating unit represented by Formula 1 and a second repeating unit represented by Formula 2:

[Formula 1]

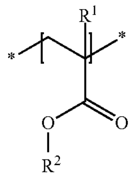

[Formula 2]

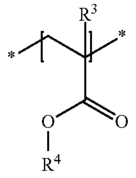

in Formulae 1 and 2, $R^1$ is a hydrogen atom, an unsubstituted methyl group, a fluorine atom, or a trifluoromethyl group, $R^2$ is a C3 to C30 fluoroaliphatic group including a hydroxyl group, $R^3$ is a hydrogen atom, an unsubstituted methyl group, a fluorine atom, or a trifluoromethyl group, and $R^4$ is a C2 to C20 organic group including an oxygen atom, wherein the first repeating unit represented by Formula 1 is different than the second repeating unit represented by Formula 2, and wherein each of the plurality of side polymer chains has a terminal group distal to the core.

2. The brush polymer as claimed in claim 1, wherein:

in Formula 1, $R^2$ is represented by Chemical Formula 1:

$*—R^{21}—(R^{22})_k$ [Chemical Formula 1]

in Chemical Formula 1, $R^{21}$ is a C1 to C20 substituted or unsubstituted linear alkylene group, a C3 to C20 substituted or unsubstituted branched alkylene group, a C3 to C20 substituted or unsubstituted cycloalkylene group, or a combination thereof, $R^{22}$ is a C3 to C6 hydroxyalkyl group in which at least one hydrogen atom of the alkyl group of the hydroxyalkyl group is substituted with a fluorine atom, and k is 1 or 2.

3. The brush polymer as claimed in claim 1, wherein, in Formula 1, $R^2$ is $—C(CF_3)_2OH$, $—C(C_2F_5)_2OH$, $—C(CF_3)(CH_3)OH$, or $—CH(CF_3)OH$.

4. The brush polymer as claimed in claim 1, wherein, in Formula 2, $R^4$ is a hydroxyl group (OH), a hydroxyalkyl group, an oxyethylene group, a carboxyl group (COOH), a carbonyl group (CO), an aldehyde group (CHO), a lactone group, a phenol group, an oxo group (O═), or a combination thereof.

5. The brush polymer as claimed in claim 1, wherein:

the brush polymer is the bottle-brush polymer, the core has a main chain including polynorbornene, and a maximum length of the main chain is greater than a maximum length of each of the plurality of side polymer chains.

6. The brush polymer as claimed in claim 1, wherein:

each of the plurality of side polymer chains has a terminal group at a terminal end thereof, and the terminal group includes a bromine atom or an organic group including a sulfur atom.

7. The brush polymer as claimed in claim 1, wherein:

the brush polymer is the star-brush polymer, the core has a pentaerythritol core structure, and each of the plurality of side polymer chains extends from the core in a radial direction.

8. The brush polymer as claimed in claim 1, wherein:

the brush polymer has a structure represented by Formula 3:

[Formula 3]

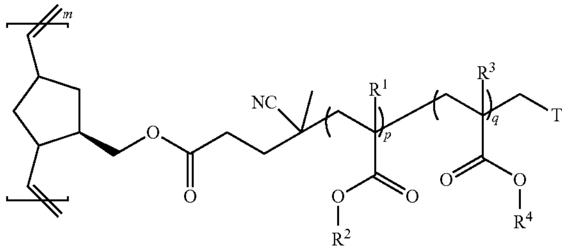

in Formula 3, $R^1$ to $R^4$ are defined the same as those of Formulae 1 and 2, m is an integer of 5 to 100, p and q are each independently an integer of 1 to 50, and T is a bromine atom or an organic group including a sulfur atom.

9. The brush polymer as claimed in claim 1, wherein:

the brush polymer has a structure represented by Formula 4:

[Formula 4]

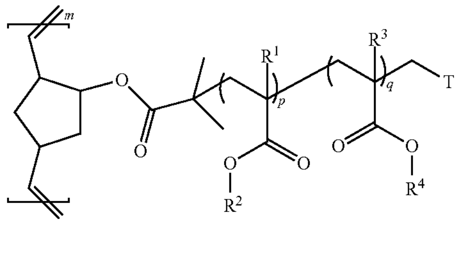

in Formula 4, $R^1$ to $R^4$ are defined the same as those of Formulae 1 and 2, m is an integer of 5 to 100, p and q are each independently an integer of 1 to 50, and T is a bromine atom or an organic group including a sulfur atom.

10. The brush polymer as claimed in claim 1, wherein:

the brush polymer has a structure represented by Formula 5:

[Formula 5]

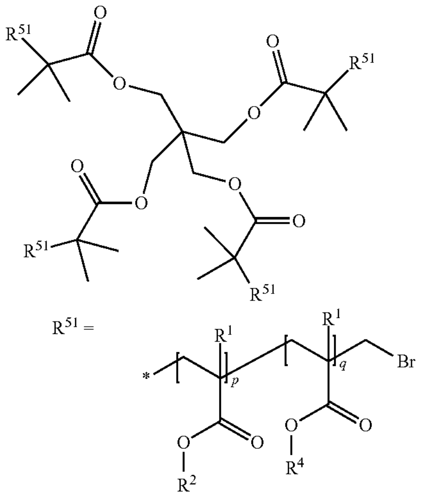

in Formula 5, $R^1$ to $R^4$ are defined the same as those of Formulae 1 and 2, and p and q are each independently an integer of 1 to 50.

11. The brush polymer as claimed in claim 1, wherein:

the brush polymer has a structure represented by Formula 6:

[Formula 6]

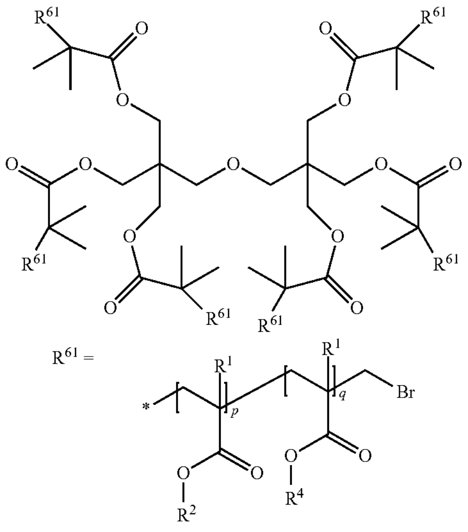

in Formula 6, $R^1$ to $R^4$ are defined the same as those of Formulae 1 and 2, and p and q are each independently an integer of 1 to 50.

12. A photoresist composition, comprising:

a brush polymer for a photoresist, the brush polymer including a core and a plurality of side polymer chains, the plurality of side polymer chains being bonded to the core and extending from the core to form a bottle-brush polymer or a star-brush polymer, together with the core;

a chemically amplified polymer;

a photoacid generator (PAG); and a solvent, wherein:

each of the plurality of side polymer chains includes a first repeating unit represented by Formula 1 and a second repeating unit represented by Formula 2:

[Formula 1]

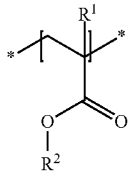

[Formula 2]

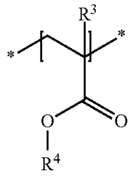

in Formulae 1 and 2, $R^1$ is a hydrogen atom, an unsubstituted methyl group, a fluorine atom, or a trifluoromethyl group, $R^2$ is a C3 to C30 fluoroaliphatic group including a hydroxyl group, $R^3$ is a hydrogen atom, an unsubstituted methyl group, a fluorine atom, or a trifluoromethyl group, and $R^4$ is a C2 to C20 organic group including an oxygen atom, wherein the first repeating unit represented by Formula 1 is different than the second repeating unit represented by Formula 2, and wherein each of the plurality of side polymer chains has a terminal group distal to the core.

13. The photoresist composition as claimed in claim 12, wherein:

the brush polymer is the bottle-brush polymer, the core has a main chain including polynorbornene, each of the plurality of side polymer chains has a terminal group at a terminal end thereof, and the terminal group includes a bromine atom or an organic group including a sulfur atom.

14. The photoresist composition as claimed in claim 12, wherein:

the brush polymer is the star-brush polymer, the core has a pentaerythritol core structure, and each of the plurality of side polymer chains extends from the core in a radial direction.

15. The photoresist composition as claimed in claim 12, wherein:

the brush polymer for photoresist has a structure represented by Formula 3:

[Formula 3]

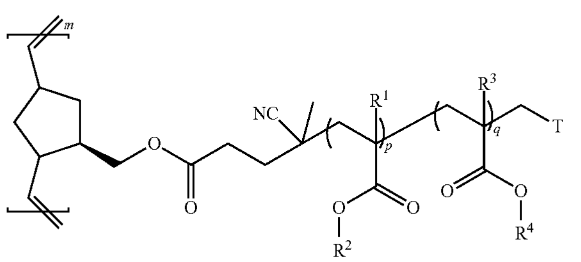

in Formula 3, $R^1$ to $R^4$ are defined the same as those of Formulae 1 and 2, m is an integer of 5 to 100, p and q are each independently an integer of 1 to 50, and T is a bromine atom or an organic group including a sulfur atom.

16. The photoresist composition as claimed in claim 12, wherein:

the brush polymer has a structure represented by Formula 4:

[Formula 4]

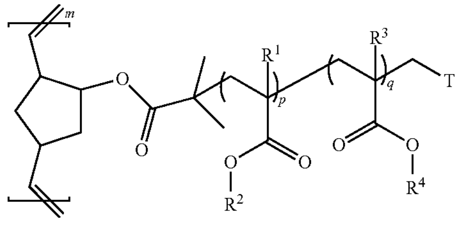

in Formula 4, $R^1$ to $R^4$ are defined the same as those of Formulae 1 and 2, m is an integer of 5 to 100, p and q are each independently an integer of 1 to 50, and T is a bromine atom or an organic group including a sulfur atom.

17. The photoresist composition as claimed in claim 12, wherein:

the brush polymer has a structure represented by Formula 5:

[Chemical Formula 5]

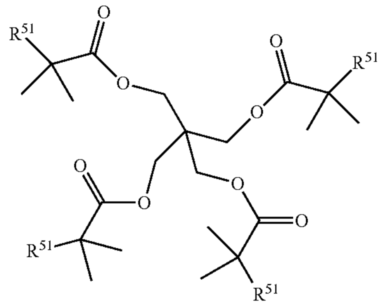

-continued $R^{51}$ =

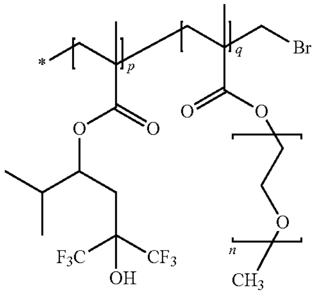

in Formula 5, $R^1$ to $R^4$ are defined the same as those of Formulae 1 and 2, and p and q are each independently an integer of 1 to 50.

18. The photoresist composition as claimed in claim 12, wherein:

the brush polymer has a structure represented by Formula 6:

[Formula 6]

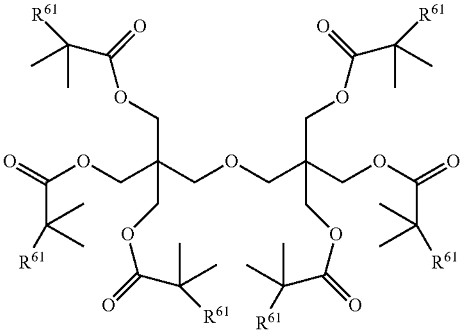

$R^{61}$ =

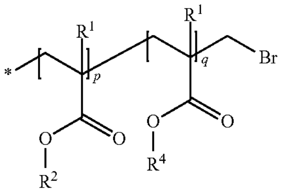

in Formula 6, $R^1$ to $R^4$ are defined the same as those of Formulae 1 and 2, and each of p and q is an integer ranging from 1 to 50.

19. A method of manufacturing an integrated circuit device, the method comprising:

forming a photoresist film on an underlying film by using a photoresist composition that includes:

a brush polymer, the brush polymer including a core and a plurality of side polymer chains, the plurality of side polymer chains being bonded to the core and extending from the core to form a bottle-brush polymer or a star-brush polymer, together with the core, a chemically amplified polymer, a photoacid generator (PAG), and a solvent;

forming a surface-modified photoresist film having a hydrophilic surface portion, the hydrophilic surface portion being formed by segregating the brush polymer from the chemically amplified polymer in the photoresist film and distributing the brush polymers at a surface of the photoresist film, which is distal to the underlying film;

generating an acid from the PAG by exposing a first area of the surface-modified photoresist film, which includes a portion of the hydrophilic surface portion, and deprotecting the chemically amplified polymer with the acid;

pre-wetting the hydrophilic surface portion of the exposed first area of the surface-modified photoresist film with deionized water;

removing the exposed first area of the surface-modified photoresist film by using a developer to form a photoresist pattern including a non-exposed area of the surface-modified photoresist film; and processing the underlying film by using the photoresist pattern, wherein:

each of the plurality of side polymer chains includes a first repeating unit represented by Formula 1 and a second repeating unit represented by Formula 2,

[Formula 1]

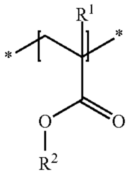

[Formula 2]

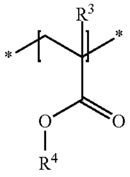

in Formulae 1 and 2, $R^1$ is a hydrogen atom, an unsubstituted methyl group, a fluorine atom, or a trifluoromethyl group, $R^2$ is a C3 to C30 fluoroaliphatic group including a hydroxyl group, $R^3$ is a hydrogen atom, an unsubstituted methyl group, a fluorine atom, or a trifluoromethyl group, and $R^4$ is a C2 to C20 organic group including an oxygen atom, wherein the first repeating unit represented by Formula 1 is different than the second repeating unit represented by Formula 2, and wherein each of the plurality of side polymer chains has a terminal group distal to the core.

20. The method as claimed in claim 19, wherein:

the brush polymer includes a brush polymer having a structure represented by Formula 3, Formula 4, Formula 5, Formula 6, or a combination thereof,

[Formula 3]

[Formula 3]

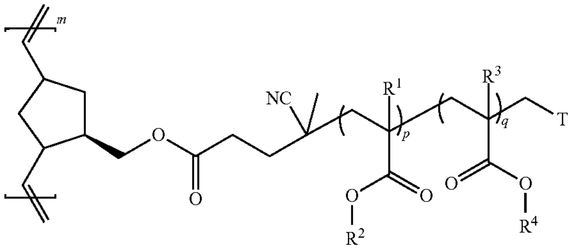

[Formula 4]

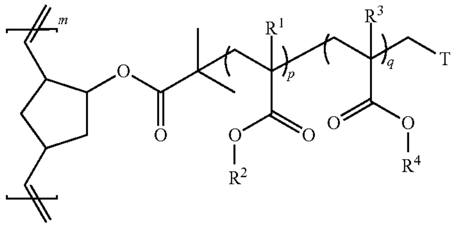

[Formula 5]

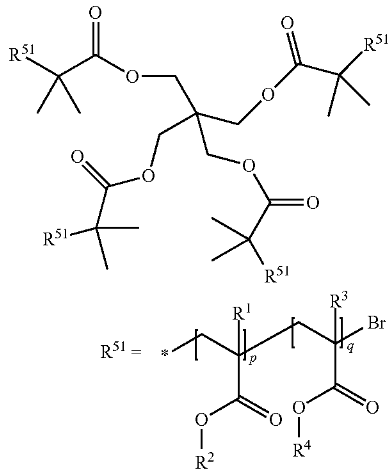

[Formula 6]

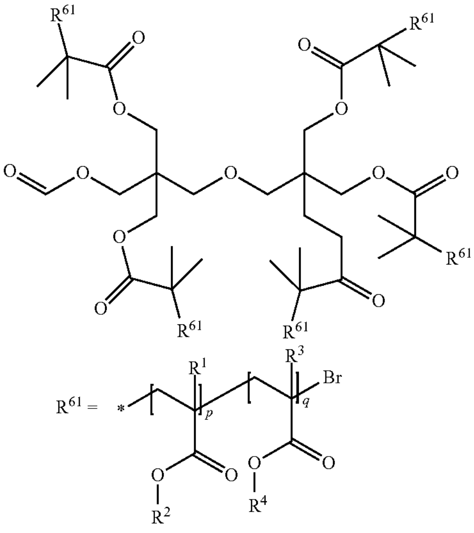

in Formulae 3 to 6, m is an integer of 5 to 100, p and q are each independently an integer of 1 to 50, T is a bromine atom or an organic group including a sulfur atom, $R^1$ is a hydrogen atom, an unsubstituted methyl group, a fluorine atom, or a trifluoromethyl group, $R^2$ is a C3 to C30 fluoroaliphatic group including a hydroxyl group, $R^3$ is a hydrogen atom, an unsubstituted methyl group, a fluorine atom, or a trifluoromethyl group, and $R^4$ is a C2 to C20 organic group including an oxygen atom.

* * * * *